(12) United States Patent
Nishio

(10) Patent No.: US 6,812,493 B2
(45) Date of Patent: Nov. 2, 2004

(54) THIN-FILM SEMICONDUCTOR ELEMENT AND METHOD OF PRODUCING SAME

(75) Inventor: Mikio Nishio, Moriguchi (JP)

(73) Assignee: Matsushita Electric Industrial Co., Ltd. (JP)

( * ) Notice: Subject to any disclaimer, the term of this patent is extended or adjusted under 35 U.S.C. 154(b) by 114 days.

(21) Appl. No.: 10/240,648

(22) PCT Filed: Apr. 4, 2001

(86) PCT No.: PCT/JP01/02920

§ 371 (c)(1),
(2), (4) Date: Oct. 4, 2002

(87) PCT Pub. No.: WO01/75981

PCT Pub. Date: Oct. 11, 2001

(65) Prior Publication Data

US 2003/0096463 A1 May 22, 2003

(30) Foreign Application Priority Data

Apr. 4, 2000 (JP) ........................................ 2000-101931

(51) Int. Cl.[7] .......................... H01L 27/108; H01L 21/84
(52) U.S. Cl. ............................. 257/69; 257/64; 257/66; 257/72; 257/75; 438/149; 438/151; 438/163; 438/164
(58) Field of Search ............................. 257/64–75, 347; 438/149–166, 609, 652, 656

(56) References Cited

U.S. PATENT DOCUMENTS

| | | | | |
|---|---|---|---|---|
| 5,574,294 A | * | 11/1996 | Shepard | 257/66 |
| 5,627,384 A | | 5/1997 | Teramoto et al. | 257/57 |
| 5,682,052 A | * | 10/1997 | Hodges et al. | 257/377 |
| 5,904,513 A | * | 5/1999 | Batra et al. | 438/162 |
| 6,184,070 B1 | * | 2/2001 | Park | 438/159 |
| 6,243,416 B1 | * | 6/2001 | Matsushiro et al. | 375/240 |
| 6,249,327 B1 | * | 6/2001 | Murade et al. | 349/43 |
| 6,346,718 B1 | * | 2/2002 | Yamanaka et al. | 257/79 |
| 6,358,766 B1 | * | 3/2002 | Kasahara | 438/30 |
| 6,387,737 B1 | * | 5/2002 | Yamazaki et al. | 438/149 |
| 6,403,395 B2 | * | 6/2002 | Hirabayashi et al. | 438/69 |
| 6,537,843 B2 | * | 3/2003 | Lyu et al. | 438/48 |
| 6,583,830 B2 | * | 6/2003 | Yasukawa et al. | 349/43 |
| 6,597,415 B2 | * | 7/2003 | Rho et al. | 349/42 |
| 6,617,644 B1 | * | 9/2003 | Yamazaki et al. | 257/347 |
| 6,635,505 B2 | * | 10/2003 | Tanaka et al. | 438/30 |
| 6,636,284 B2 | * | 10/2003 | Sato | 349/110 |

(List continued on next page.)

FOREIGN PATENT DOCUMENTS

| | | |
|---|---|---|
| DE | 4413081 | 3/1995 |
| DE | 19725916 | 1/1999 |
| DE | 19858589 | 6/2000 |

(List continued on next page.)

OTHER PUBLICATIONS

J. Krueger, et al., "Maschinendiagnose ueber das Internet", ZWF 91 (1996) 12, pp. 604–606.

*Primary Examiner*—Michael Lebentritt
(74) *Attorney, Agent, or Firm*—Parkhurst & Wendel, L.L.P.

(57) ABSTRACT

The present invention provides a thin film semiconductor element which is small in area with high on-current enough to be suitable for the power saving, miniaturization, and high definition display of a device. According to the present invention, an outer shape of a semiconductor thin film is processed and regions (a channel region, a source region, and a drain region) in the semiconductor thin film are formed by using, as masks, other element components such as a gate electrode. Specifically, ion-implanted regions are formed by implanting impurity ions into predetermined regions of the semiconductor thin film using, as a mask, the gate electrode overlapped on the thin film via an insulation film. Thereafter, the semiconductor is processed into a predetermined shape by etching using, as masks, previously formed element components such as the gate electrode.

17 Claims, 23 Drawing Sheets

U.S. PATENT DOCUMENTS

| | | | |
|---|---|---|---|
| 6,653,567 B2 * | 11/2003 | Ritter et al. | 174/66 |
| 6,664,576 B1 * | 12/2003 | Breen et al. | 257/220 |
| 6,674,495 B1 * | 1/2004 | Hong et al. | 349/43 |
| 6,692,997 B2 * | 2/2004 | So et al. | 438/151 |
| 6,696,309 B2 * | 2/2004 | Yamanaka et al. | 438/30 |

FOREIGN PATENT DOCUMENTS

| | | |
|---|---|---|
| JP | 62-123772 | 6/1987 |
| JP | 6-123772 | 8/1987 |
| JP | 64-057970 | 3/1989 |
| JP | 01183853 | 7/1989 |
| JP | 01-183853 | 7/1989 |
| JP | 03-024735 | 2/1991 |
| JP | 04-032266 | 2/1992 |
| JP | 05-251667 | 9/1993 |
| JP | 05-291292 | 11/1993 |
| JP | 05291292 | 11/1993 |
| JP | 06-102531 | 4/1994 |
| JP | 06-291142 | 10/1994 |
| JP | 07-226515 | 8/1995 |
| JP | 07-335763 | 12/1995 |
| JP | 06031765 | 2/1996 |
| JP | 08-031765 | 2/1996 |
| JP | 07-228515 | 8/1996 |
| JP | 08-204030 | 8/1996 |
| JP | 09-246555 | 9/1997 |
| JP | 10-093091 | 4/1998 |
| JP | 06-204030 | 6/1998 |
| JP | 10-233457 | 9/1998 |
| JP | 11-236825 | 9/1999 |
| JP | 11-2360825 | 9/1999 |
| JP | 11-307763 | 11/1999 |
| JP | 11-307783 | 11/1999 |

* cited by examiner

THIN-FILM SEMICONDUCTOR ELEMENT AND METHOD OF PRODUCING SAME

TECHNICAL FIELD

The present invention relates to a method of producing a thin film semiconductor element, and more particularly to its improvement in miniaturization, price, and performance.

BACKGROUND ART

In recent years, progress in flat displays represented by liquid crystal display panels is remarkable.

In liquid crystal displays, active matrix liquid crystal displays having switching elements disposed in each pixel have become widespread.

In other display panels such as plasma displays, electroluminescence displays, and field emission displays, switching elements are disposed for controlling pixels.

As these switching elements, MIMs (metal-insulator-metal) and TFTs (thin-film-transistor) are employed.

TFTS, on one hand, are excellent in fast-response, but on the other, their complicated production process increases production cost, thereby arousing the need for cheaper TFTs. In addition, in display panels such as liquid crystal displays, switching elements are disposed in non-display regions unused for displaying pixels, thereby arousing the need for miniaturized TFTs in terms of high definition display. The miniaturization of TFTs is also needed for other devices in terms of highly dense packages on substrates.

A top gate type MIS (metal-insulator-semiconductor) TFT widely used in liquid crystal displays and the like is shown in FIGS. 20a and 20b.

A TFT, which is disposed on an insulation substrate 1 composed of glass or the like via an undercoat layer 2, is provided with a semiconductor thin film 3 composed of amorphous silicon (a-Si), polycrystal silicon (p-Si), or the like. In a source region 3b and a drain region 3c of the semiconductor thin film 3, N type or P type impurity ions are implanted. When voltage is applied on a gate electrode 5a disposed above a channel region (active region) 3a of the semiconductor thin film 3 via an insulation film 4, a source electrode wiring line 8b and a drain electrode wiring line 8c are electrically connected.

The undercoat 2 prevents impurities from mixing from the substrate 1 into the semiconductor thin film 3, and is composed of silicon oxide, for example. A gate insulation film 4a is composed of silicon oxide, for example.

The gate electrode 5a is composed of a metal with a high melting point of 1000° C. or more such as chromium in order to resist heat treatment to activate a semiconductor thin film in production process.

This TFT is produced in the following manner, for example.

First, as shown in FIG. 21a, an undercoat layer 2 and a semiconductor thin film 3 are formed on one surface of a substrate 1, and the thin film 3 is then processed into a predetermined pattern by etching using a resist layer 18 as a mask.

Next, on the semiconductor thin film 3, an insulation film 4 and a gate electrode 5a are formed. For example, as shown in FIG. 21b, the insulation film 4 composed of silicon oxide and a conductive film 5 composed of chromium are formed to cover the semiconductor thin film 3. Thereafter, the conductive film 5 is processed into a predetermined pattern by etching using a resist layer 19 as a mask, thus forming the gate electrode 5a.

Using the formed gate electrode 5a and the insulation film 4 as masks, P type or N type impurity ions are implanted in the semiconductor thin film 3, thus forming a source region 3b and a drain region 3c, as shown in FIG. 21c.

Note that, in the case of a TFT with an LDD (lightly-doped drain) structure, ions are further implanted into any one of the above-formed source region 3b and drain region 3c separated from the channel region 3a so that the separated region has a higher ion concentration.

In the case of a TFT with what is called an "offset structure", a mask covering a periphery of the gate electrode 5a is used for the above-described ion-implanting.

Thereover, an insulation film 6 composed of silicon oxide, for example, is formed, and in this insulation film 6, a contact hole 6a for connecting the source region 3b and drain region 3c of the thin film 3 to external wiring lines is formed by etching using resist layers 21 as masks.

Thereover, after forming the contact hole 6a, a conductive film 8 composed of aluminum, for example, is formed as shown in FIG. 21e, and a source electrode wiring line 8b, a drain electrode wiring line 8c, and the like are formed by etching using resist layers 20 as masks, thereby obtaining the TFT shown in FIGS. 20a and 20b.

Thereover, in an actual device, other signal wiring lines such as a line to connect a source wiring line to a signal source and the like are further formed via an insulation film in a similar manner.

Generally, elements are designed to avoid variations in the properties of finished products caused by errors and variations in production processes. Design margins for stable production may be one of factors to prevent the miniaturization of elements. In the production of the above-described conventional TFT, such designs are indispensable as to avoid size variations of masks used in etching and ion-implanting, and mispositioning of masks and substrates (or thin films to be processed). For example, when forming a contact hole, they need to be considered to secure a sufficient distance between a place where the contact hole is disposed and a gate electrode. Accordingly, conventional TFTs have been forced to be made longer in their longitudinal directions than preferable designs in terms of functionality.

The above-described design margins may also reduce the properties of elements and devices using the elements. For example, distances between edge portions of a channel region and source/drain electrode wiring lines, in other words, a distance between a gate electrode and a contact hole has great effect on electric current strength between the source/drain electrode wiring lines in the on-state of an element. It is difficult to reduce the electric resistance of source/drain regions down to the levels of metal wiring lines, even if impurity concentrations of the regions are increased. In addition, extreme increase in the impurity concentrations of the regions makes the element less reliable. Thus, the design margin between the gate electrode and the contact hole increases source/drain electric resistance, thereby reducing electric current in the on-state of the element.

DISCLOSURE OF THE INVENTION

It is an object of the present invention to solve the foregoing problems and provide a thin film semiconductor element which is small in area with high on-current enough to be suitable for the power saving, miniaturization, and high definition display of a device. It is another object of the present invention to provide such excellent thin film semiconductor element at low price.

The present invention reduces an element area to a great extent by reducing source/drain areas of a transistor. Also, the present invention increases on-current of the element by extensively reducing distances between a gate electrode and source/drain electrodes (wiring lines).

Moreover, the present invention simplifies production process of an element.

According to the present invention, an outer shape of a semiconductor thin film is processed, and regions (a channel region, a source region, and a drain region) of the semiconductor thin film are formed by using other element components as masks such as a gate electrode. Specifically, the gate electrode and the like are formed first, and then the semiconductor thin film is self-aligningly processed in correspondence with shapes of those components Thus, design margins required of the production of conventional thin film semiconductor elements are made less to the greatest possible degree, and a thin film semiconductor element which is small in size and excellent in properties is realized. In addition, production process is simplified such as to decrease the number of masks required.

In the production of a thin film semiconductor element of the present invention, an ion-implanted region is formed by implanting impurity ions into a predetermined region of a semiconductor thin film using, as a mask, a gate electrode overlapped on the thin film via an insulation layer. The semiconductor thin film is then processed into a predetermined shape by etching using, as masks, previously formed other element components such as the gate electrode. It is needless to form a mask used only for processing the semiconductor thin film so that a source region and a drain region both implanted with the impurity ions are disposed to face each other sandwiching a channel region (active region).

A thin film semiconductor is produced by the following method, for example.

First, a semiconductor thin film to be an active region is formed on an insulation substrate, and thereon, a first insulation film, a conductive film, and a second insulation film are formed in this order.

Next, the conductive film is processed into a predetermined pattern by etching, thereby forming a gate electrode. On such occasion, the second insulation film formed on the conductive film is processed into a similar pattern.

For example, on a surface of the second insulation film, a first resist layer having a predetermined pattern is formed, and thereafter, the second insulation film and a first conductive film are etched using the first resist layer as a mask, whereby the first conductive film is processed into the gate electrode. Note that, if the first insulation film below the conductive film is processed simultaneously, a gate insulation layer is formed as well between the gate electrode and the semiconductor thin film. After the etching, the first resist layer is removed.

Next, N type or P type impurity ions are implanted into the semiconductor film formed under the gate electrode using the gate electrode as a mask. Here, in the semiconductor thin film, a region covered with the gate electrode is processed into a channel region of a transistor. Impurities are implanted into a predetermined region of the semiconductor thin film through the first insulation layer or directly using the gate electrode as a mask. Note that, in order to avoid a source/drain short circuit of a transistor to be formed, second resist layers are preferably formed for covering edge regions of the channel region of the semiconductor thin film so as to serve as masks along with the gate electrode. After ion-implanting, the second resist layers are removed.

When an insulation film covering a surface of the semiconductor thin film is removed in advance of impurity ion-implanting into the thin film, impurity ion-implanting with high efficiency is made possible with low energy compared with impurity ion-implanting through the insulation film. In addition, impurity ions can be implanted in a concentrated manner easily. Amount variations of implanted ions caused from uneven film thickness of an insulation film may be avoided, making it possible to obtain a thin film semiconductor device with good uniformity in electric properties.

Next, a frame-shaped insulation wall to cover side surfaces of the gate electrode is formed. For example, an insulation film is formed uniformly on the substrate and then removed except for portions around the gate electrode by anisotropic etching. Portions of the insulation film around the gate electrode are thicker than flat regions, in other words, a region in which the gate electrode is disposed and a region in which the first insulation layer (or the semiconductor thin film) is exposed. Accordingly, by properly adjusting conditions of subsequent etching, it is made possible that an insulator remains only around the gate electrode.

After forming the insulation wall, a second conductive film is formed to cover one surface of an insulation substrate having formed thereon the semiconductor thin film, and the second conductive film is then processed into wiring lines connected to a source region and a drain region by etching using resist layers having predetermined patterns as masks. In this etching, since the gate electrode and the insulation wall also serve as masks, the semiconductor thin film disposed under them is processed into a predetermined shape having the source region and the drain region.

After forming the source electrode and the drain electrode, a third insulation film is formed all over the substrate. Next, an aperture portion is formed in a region of the third insulation film covering the gate electrode, and in a region including this aperture portion, other wiring lines connected to the gate electrode such as a scanning signal line are formed, thereby obtaining a semiconductor element.

Note that, when implanting impurity ions after forming the insulation wall, the impurity ions are not implanted into a region of the semiconductor thin film covered by the insulation wall, thereby obtaining a thin film semiconductor with what is called an offset structure.

When, after forming the insulation wall but before forming the second conductive film using the gate electrode and the insulation wall as masks, a same type of impurity ions as that used in the previous ion-implanting are implanted into the semiconductor thin film in order to form sub regions with higher impurity ion concentrations in the semiconductor thin film, whereby a semiconductor element with what is called an LDD (lightly-doped drain) structure is obtained.

What is called a CMOS transistor using a P transistor and an N transistor in pairs can be produced by a same method as that described above. Specifically, when impurity ion-implanting is carried out on one transistor, such masks may be used as to have patterns to cover regions of the other transistor to be implanted with impurity ions (or a region which has already been implanted).

Preferably, after forming the third insulation film, heat treatment is carried out on the semiconductor thin film for activation.

A thin film semiconductor element is also produced by the following method.

First, similarly to the above, a semiconductor thin film, a first insulation film, a first conductive film, and a second insulation film are formed in this order. Next, the conductive film is processed into a predetermined pattern by etching, thereby forming a gate electrode. On such occasion, the second insulation film formed on the conductive film is processed into a similar pattern.

For example, after forming first resist layers having predetermined patterns on a surface of the second insulation film, the second insulation film and the first conductive film are etched using the first resist layer. Note that, if the first insulation film formed under the conductive film is processed simultaneously, a gate insulation layer is formed between the gate electrode and the semiconductor thin film. After the etching, the first resist layers are removed.

Next, impurity ions are implanted into the semiconductor thin film through the first insulation film or directly using the gate electrode as a mask. Note that, in order to avoid a source/drain short circuit of a transistor to be formed, second resist layers are preferably formed for covering edge portions of a channel region of the semiconductor thin film to serve as masks along with the gate electrode. After ion-implanting, the second resist layers are removed.

Next, similarly to the above, a frame-shaped insulation wall to cover side surfaces of the gate electrode is formed. Specifically, an insulation film is formed uniformly on the substrate and then removed except for portions around the gate electrode by anisotropic etching. On such occasion, regions of the semiconductor thin film under an insulator formed to connect to the gate electrode and side surfaces thereof are removed by etching, and the thin film is divided into pieces to be used in an element. Here, when the first insulation film is not processed into a gate insulation film, regions of the first insulation film which are exposed and not covered by the masks are removed simultaneously, thus forming the gate insulation film.

By the above etching, the semiconductor thin film is processed, whereby edge surfaces thereof are exposed. Wiring lines connected to a source electrode and a drain electrode are formed to contact with the exposed end surfaces of the processed semiconductor thin film which are implanted with impurity ions.

After forming the source electrode and the drain electrode, a third insulation film is formed all over the substrate. Next, an aperture portion is formed in a region of the third insulation film covering the gate electrode, and in a region including this aperture portion, other wiring lines connected to the gate electrode such as a scanning signal line are formed, thus obtaining a semiconductor element.

The production method of the present invention can be applied to a semiconductor element with what is called an LDD (lightly-doped drain) structure. Generally, when etching is carried out using a mask, one side of an obtained pattern next to the mask has approximately a same outer shape as that of the mask, but the other side of the obtained pattern has a larger outer shape than that of the mask. Accordingly, one side (upper side) of a pattern of a semiconductor thin film next to an insulation wall has approximately a same outer shape as that of the insulation wall, but the other side (lower side) of the pattern has a larger outer shape than that of the wall, the both sides being obtained by forming a frame-shaped insulation wall to surround a gate electrode and by processing the semiconductor thin film into a predetermined pattern. Using the insulation wall and the gate electrode as masks, a same type of impurities as that implanted in the previous are implanted into regions of the semiconductor thin film which have already been implanted with the impurity ions and are not covered by the insulation wall so that impurity-ion concentrations of the regions are made higher than those of regions covered by the insulation wall. Thus, an LDD structure is obtained.

When, after forming the insulation wall to surround the gate electrode, ions are implanted into the semiconductor thin film using the insulation wall and the gate electrode as masks, whereby a thin film semiconductor element with an offset structure is obtained.

In the case where a P channel semiconductor element and an N channel semiconductor element are formed on a same substrate such as in a CMOS transistor, second resist layers with different patterns from each other may be used when implanting P type and N type impurities.

A thin film semiconductor element of the present invention comprises:

A semiconductor thin film having in a pair of edge portions thereof a source region and a drain region both implanted with impurity ions;

An insulation film to cover one surface of the semiconductor thin film;

A gate electrode disposed to counter a region of the semiconductor thin film via the insulation, the region not being implanted with the impurity ions;

A frame-shaped insulation wall to cover a periphery of the gate electrode;

A source wiring line connected to the source region; and

A drain wiring line connected to the drain electrode;

A whole of the semiconductor thin film is covered by the gate electrode, the insulation wall, the source wiring line, and the drain wiring line.

Preferably, a shape of the semiconductor thin film is substantially equal to an outer shape of a combination of the gate electrode, the insulation wall, the source wiring line, and the drain wiring line.

Another thin film semiconductor element of the present invention comprises:

A semiconductor thin film having in a pair of edge portions thereof a source region and a drain region both implanted with impurity ions;

A frame-shaped insulation wall to cover a periphery of the semiconductor thin film;

An insulation film to cover one surface of the semiconductor thin film;

A gate electrode disposed to counter a region of the semiconductor thin film via the insulation film, the region not being implanted with the impurity ions;

A source wiring line connected to the source region; and

A drain wiring line connected to the drain electrode; and

A shape of the semiconductor thin film is substantially equal to an outer shape of the insulation wall;

The source wiring line and the drain wiring line are connected, for example, to edge surfaces of the semiconductor thin film in which the source region and the drain region are formed.

A thin film semiconductor element of the present invention is used as a switching element for controlling operations of light control means and light emission means in liquid crystal display panels, organic EL display panels, display panels, and the like.

Note that the present invention has a utility particularly for what is called a top-gate semiconductor element in which a gate electrode is disposed above a semiconductor thin film, but the present invention also has a utility for what is called a bottom-gate semiconductor element in which a gate electrode is disposed under a semiconductor thin film.

Impurities for forming a source region and a drain region are implanted into a semiconductor thin film by, for example, a plasma doping method. In addition, a source region and a drain region can also be formed by a method such that, after the introduction of impurities into wiring lines connected to the regions, the impurities are diffused into the semiconductor thin film by heat treatment.

As impurities for an N channel transistor, phosphorous is used, and as impurities for a P channel transistor, boron is used, for example.

According to the present invention, since a thin film semiconductor element excellent in fast-response can be obtained, it is made possible to produce a display panel for a large screen by using the element as a switching element.

DESCRIPTION OF REFERENCE NUMERALS

Figure 1A:
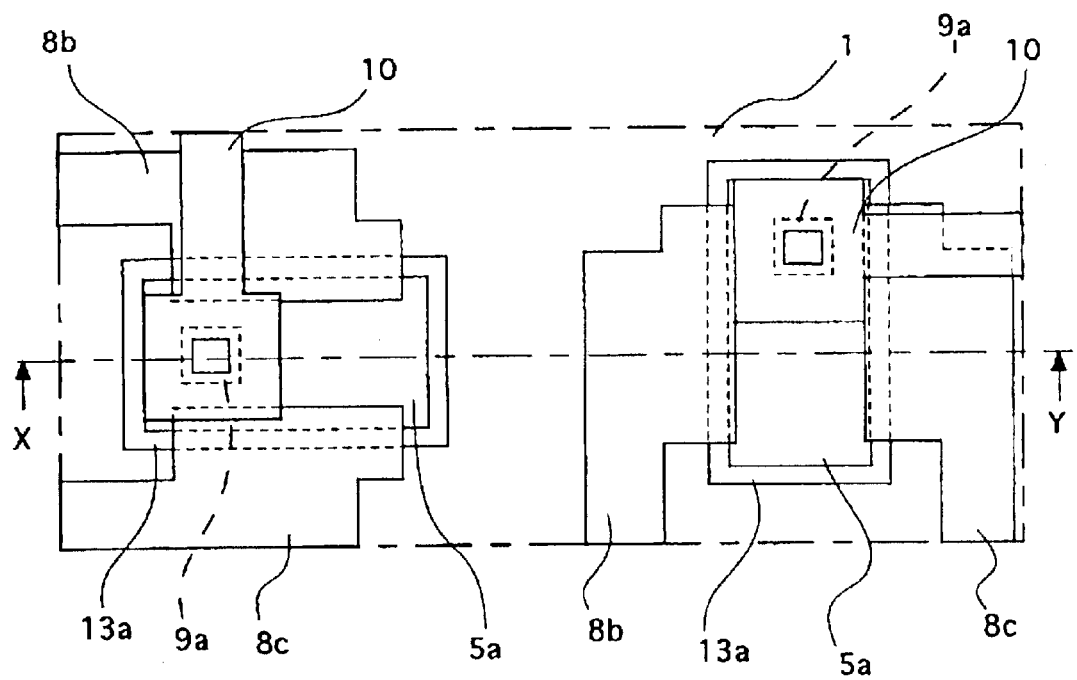
FIG. 1a is a plan view showing a semiconductor element of an embodiment of the present invention.

1 Insulation substrate
2 Undercoat layer
3, 23 Semiconductor thin film
3a Channel region
3a Source region
3c Drain region
3d High concentration region
3e Low concentration region
3f Ion-implanted region
3g Offset region
3n N type impurity region
3p P type impurity region
4, 6, 9, 13, 15 Insulation film
4a Gate insulation film
5, 8, 16 Conductive film
5a Gate electrode
6a Contact hole
7 Thin film transistor (TFT)
7a P channel transistor
7b N channel transistor
8a Signal wiring line
8b Source electrode wiring line
8c Drain electrode wiring line
9a Contact hole
10, 20a, 20b, 20c Signal wiring line
11, 12, 14, 16, 17, 18, 19, 20, 21, 110, 111, 114 Resist layer
13a Insulation wall
200 Array substrate
201 Transparent pixel electrode
202 Scanning signal line
203 Image signal line
204 Liquid crystal layer
205 Transparent counter electrode
206 Backlight
207a, 207b Polarizing plate
208 Counter substrate
209 Alignment film
210 Color filter layer
300 Glass substrate
301 Organic EL material layer
302, 303 Electrode

Best Mode for Carrying Out the Invention

Preferable embodiments of the present invention will be described in detail below using drawings.

Embodiment 1

In the present embodiment, a thin film transistor (TFT) will be described as an example of a thin film semiconductor element of the present invention.

Figure 1B:
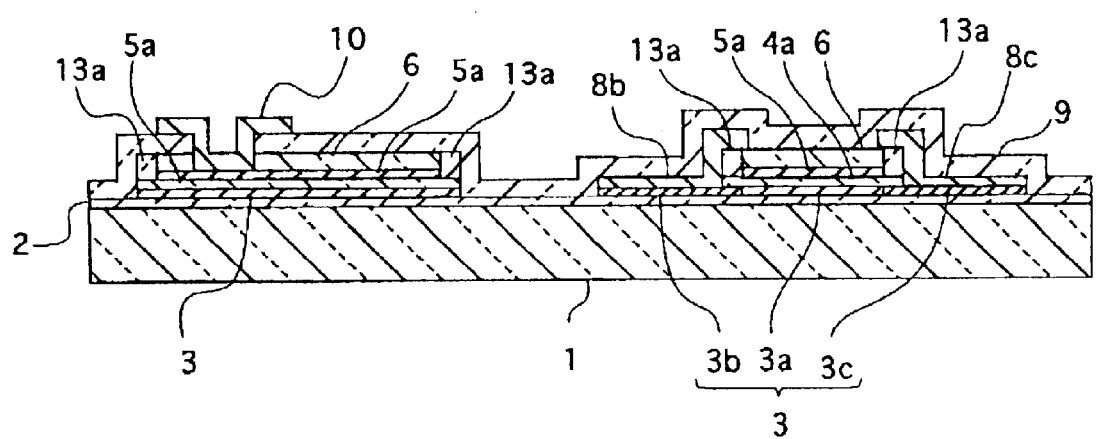
FIG. 1b is a schematic longitudinal section of the element.

FIGS. 1a and 1b show a TFT of the present embodiment.

On a surface of an insulation substrate 1, a semiconductor thin film 3 composed of polycrystal silicon, for example, is formed.

The semiconductor thin film 3 has a channel region (active region) 3a not containing impurities, and a source region 3b and a drain region 3c implanted with P type or N type impurities.

An undercoat layer 2 sandwiched between the insulation substrate 1 and the semiconductor thin film 3 prevents impurity diffusion from the insulation substrate 1 to the semiconductor 3 and occurrence of lattice defects on a surface of the channel region 3a.

Above an upper surface of the semiconductor thin film 3, a gate electrode 5a is formed to cover almost an entire surface of the channel region 3a via a gate insulation film 4a. A length of the channel region 3a of the semiconductor thin film 3 is substantially equal to that of the gate electrode 5a. An upper surface of the gate electrode 5a is covered by an insulation film 6 composed of silicon oxide, and side surfaces of the electrode are covered by a frame-shaped insulation wall 13a. An outer shape of the insulation wall 13a is substantially equal to that of the semiconductor thin film 3 disposed below the wall or that of the gate insulation film 4a.

The semiconductor thin film 3 is covered by the gate electrode 5a, the insulation wall 13a, a source electrode wiring line 8b, and a drain electrode wiring line 8c. A region of the semiconductor thin film 3 covered by the gate electrode 5a via the gate insulation film 4a composes the channel region 3a not implanted with impurities. Regions of the semiconductor thin film 3 which are covered by the insulation wall 13a and equal to a pair of side face portions of the channel region 3a also compose the channel region 3a. That is to say, a source region 3b and a drain region 3c are separated by the channel region 3a with high resistance. The source region 3b is covered by the insulation wall 13a or the source electrode wiring line 8b. The drain region 3c is covered by the insulation wall 13a or the drain electrode wiring line 8c.

The source electrode wiring line 8b and the drain electrode wiring line 8c are electrically insulated from the gate electrode 5a by the insulation film 6, the insulation wall 13a, and the like. One surface of the substrate 1 having disposed thereon the semiconductor thin film 3 and the like is covered by an insulation film 9 composed of silicon oxide. A signal wiring line 10 formed on the insulation film 9 is electrically connected to the gate electrode 5a at a contact hole 9a formed in the insulation film 9.

This TFT of the present embodiment is produced in the following manner, for example.

Figure 2A:
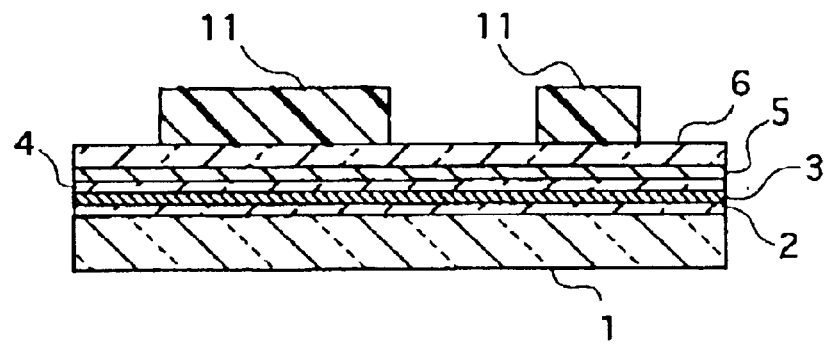
FIGS. 2a to 2g are schematic longitudinal sections showing the conditions of each step of the production process of the element.

As shown in FIG. 2a, an undercoat layer 2 composed of silicon oxide, for example, is formed on an insulation substrate 1, and thereover a semiconductor thin film 3 composed of polycrystal silicon is formed. Thereafter, to cover the semiconductor thin film 3, an insulation film 4 composed of silicon oxide and a conductive film 5 composed of a moribdenum tungsten alloy are formed. To cover them, an insulation film 6 composed of silicon oxide, for example, is formed all over the substrate 1.

Next, a resist layer 11 is formed to cover a region of the semiconductor thin film 3 in which a channel region 3a is to be disposed. Using the resist layer 11 as a mask, the insulation film 4 and the conductive film 5 are etched. By this etching, the conductive film 5 is processed into a gate electrode 5a of a desired TFT, and the insulation film 4 covered by the conductive film 5 is processed into a gate insulation film 4a.

Figure 2B:
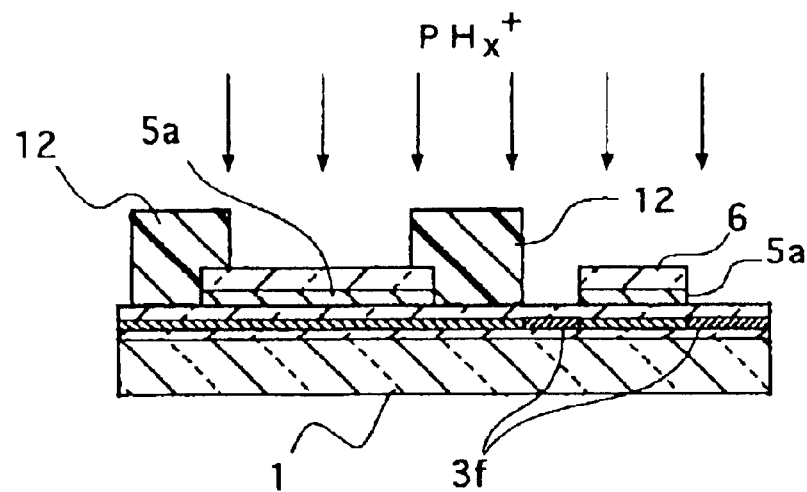

After removing the resist layer 11, impurity ions are implanted into predetermined regions (ion-implanted regions 3f) of the semiconductor thin film 3. Here, since the gate electrode 5a serves as a mask, a region of the semiconductor thin film 3 of which a surface is covered by the gate electrode 5a is not implanted with the impurity ions. In a desired TFT, a source region 3b and a drain region 3c both formed by implanting the impurity ions are disposed to sandwich a channel region 3a between the regions. In advance of ion-implanting, as shown in FIG. 2b, resist layers 12 are preferably formed to cover a pair of parallel end portions of the gate electrode 5a in a rectangle shape in order to avoid a source/drain short circuit. Using the resist layers 12 and the gate electrode 5a as masks, phosphorus is implanted as N type impurities into the semiconductor thin film 3 by a plasma doping method using a phosphine gas ($PH_3$), for example.

Figure 2C:
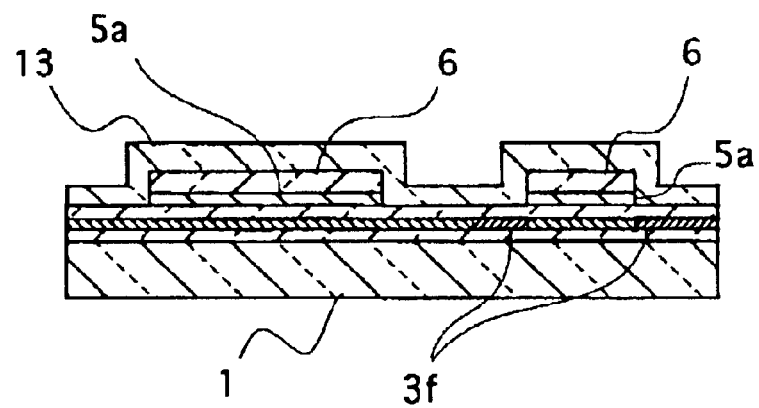
Figure 2D:
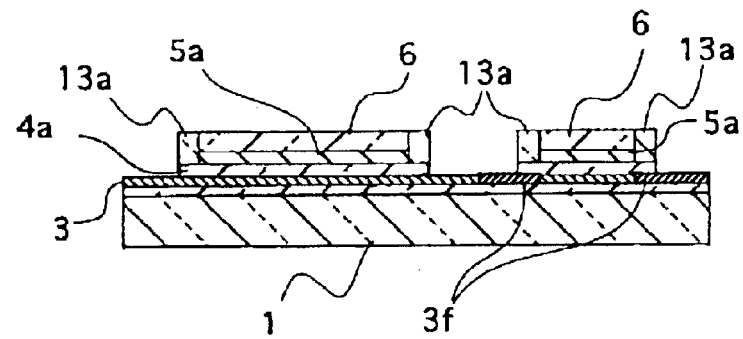

After removing the resist layers 12, as shown in FIG. 2c, to cover entire one surface of the insulation substrate 1 having disposed thereon the semiconductor thin film 3, an insulation film 13 composed of silicon oxide, for example, is formed. Generally, when forming a film on a concavo-convex surface, an uneven region of the obtained film is thicker than a flat region. Accordingly, as shown in FIG. 2c, flat regions of the insulation film 13 are thicker than regions of the film 13 around the gate electrode 5a. Consequently, when anisotropic etching (dry etching) is carried out in a direction of a normal to the substrate 1, only portions of the insulation film 13 around the gate electrodes 5a remain, whereby a frame-shaped insulation wall 13a to cover side surfaces of the gate electrode 5a is self-aligningly formed, as shown in FIG. 2d. In addition, by this etching, regions of the insulation film 4 on which the gate electrode 5a is not disposed are removed, thereby forming the gate insulation film 4a.

Figure 2E:
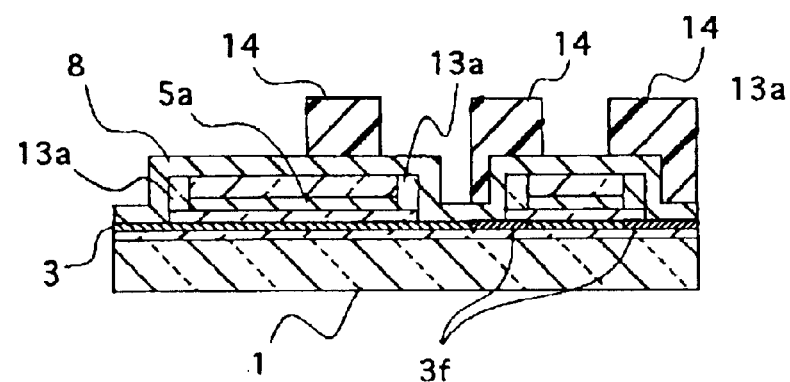
Figure 2F:
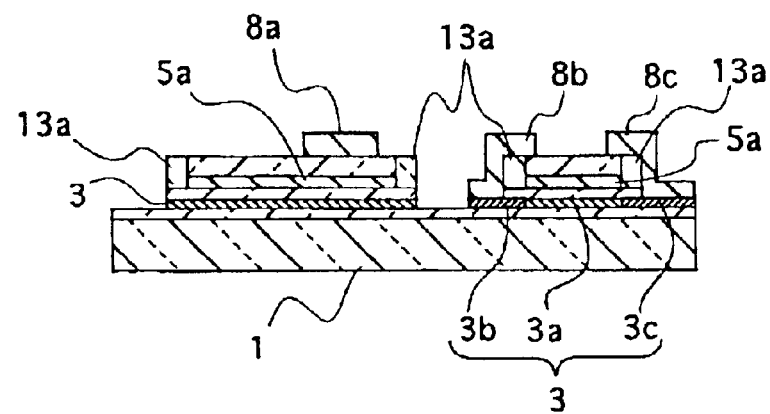

After forming the insulation wall 13a, wiring lines such as a drain electrode wiring line 8b and a source electrode wiring line 8c are formed. As shown in FIG. 2e, to cover the one surface of the substrate 1 having disposed thereon those films, a conductive film 8 composed of titanium, for example, is formed. After forming resist layers 14 to cover regions of the conductive film 8 to be processed into the wiring lines, unnecessary regions of the conductive film 8 are removed by etching. Thereby, as shown in FIG. 2f, the source electrode wiring line 8b, the drain electrode wiring line, and the like are formed.

By this etching, regions of the semiconductor thin film 3 that have been exposed before forming the conductive film 8 and not been covered by the resist layers 14 are removed, and thereby only regions of the semiconductor thin film 3 covered by the gate electrode 5a, the source electrode wiring line 8b, the drain electrode wiring line 8c, the insulation wall 13a, and the resist layers 14 remain. Accordingly, the semiconductor thin film 3 is self-aligningly split into the source region 3b, the drain region 3c, and the channel region 3a sandwiched between the source and drain regions.

After removing the resist layers 14, to cover the one surface of the substrate 1, an insulation film 9 composed of silicon oxide is formed.

After forming the insulation film 9, the source region 3b and the drain region 3c of the semiconductor thin film 3 both implanted with phosphorus are activated by carrying out heat treatment on the substrate 1 at, for example, 400° C. to 600° C. and a decrease in contact resistance is attempted between the source region 3b and the source electrode wiring line 8b and between the drain region 3c and the drain electrode wiring line 8c.

Next, signal wiring lines connected to electrodes such as a scanning wiring line, an image signal line, and other signal wiring lines are formed.

Figure 2G:
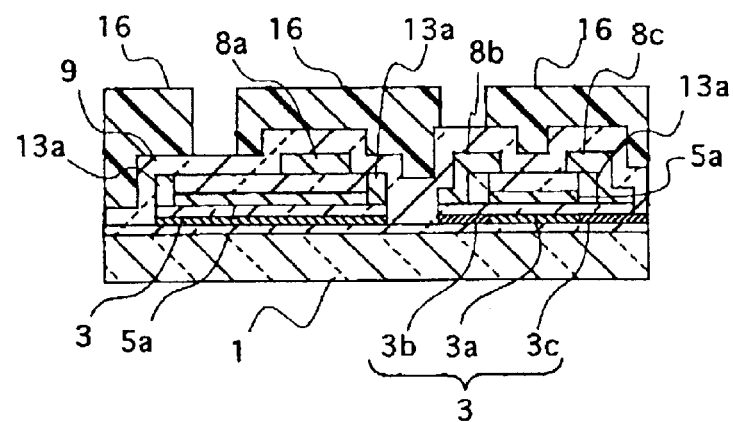

As shown in FIG. 2g, a resist layer 16 is formed with a pattern having an aperture in a region in which wiring lines and electrodes contact with each other. By etching using the resist layer 16 as a mask, an exposed region of an insulation film 15 are removed, thereby forming a contact hole 9a.

Subsequently, a conductive film composed of aluminum, for example, is formed all over the substrate 1 and then processed into a predetermined pattern to form signal wiring lines 10 such as the scanning signal line and the image signal line, thus forming the TFT shown in FIGS. 1a and 1b.

Thus, according to the present embodiment, a semiconductor thin film is formed self-aligningly. In other words, a region to be processed into a channel region (or regions to be processed into a source region and a drain region) is defined by a shape of a gate electrode In addition, a shape of the semiconductor thin film is defined by shapes of source/drain electrodes formed concurrently with the thin film. According to the present invention, since these TFT components are formed self-aligningly, a semiconductor element with stable properties can be produced.

According to the present invention, a distance between source/drain electrodes and a gate electrode is defined by a thin insulation wall, thereby making it possible to shorten the distance compared with a conventional element. In addition, since resistant components in source/drain regions is minimized when an element is on, source/drain resistance is small and on-current is high compared with a conventional element. Moreover, since sufficient contact areas are secured between source/drain regions and electrode materials, contact resistance between the regions and the materials is reduced compared with a conventional element.

Furthermore, an occupancy area of an element can be made smaller than that of a conventional element, making it possible to dispose the element with high density. In addition, using TFTs of the present invention as switching elements for controlling pixels of liquid crystal display panels, organic EL display panels, and the like contributes to improvement in numerical apertures of the pixels and to high definition displays.

In addition, according to the present invention, production process of an element is extensively simplified. For example, unlike a conventional element, it is needless to form a contact hole in an insulation film between source/drain regions and electrode materials to connect the regions and the materials electrically.

Figure 22A:
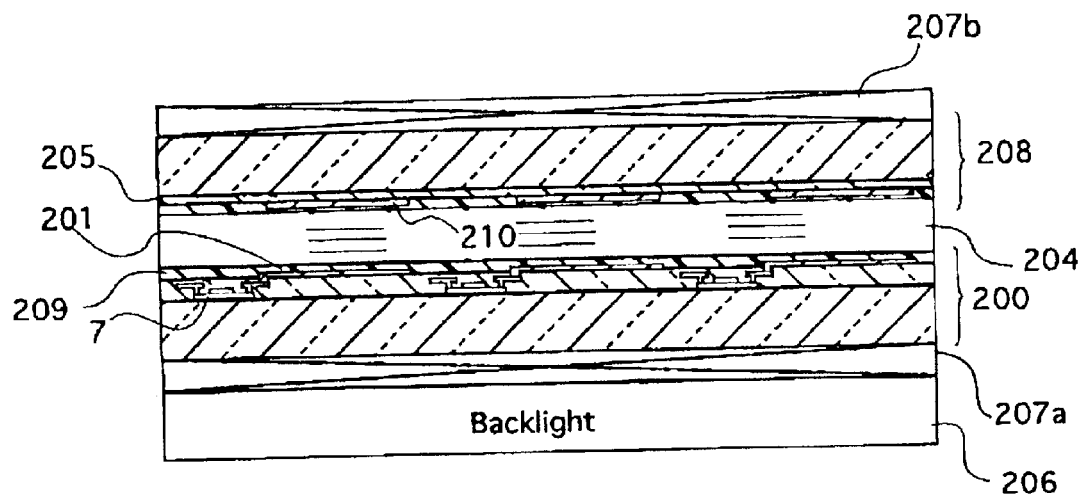
FIG. 22a shows a schematic longitudinal section of an essential portion of an active matrix liquid crystal display panel using a TFT as a switching element.
Figure 22B:
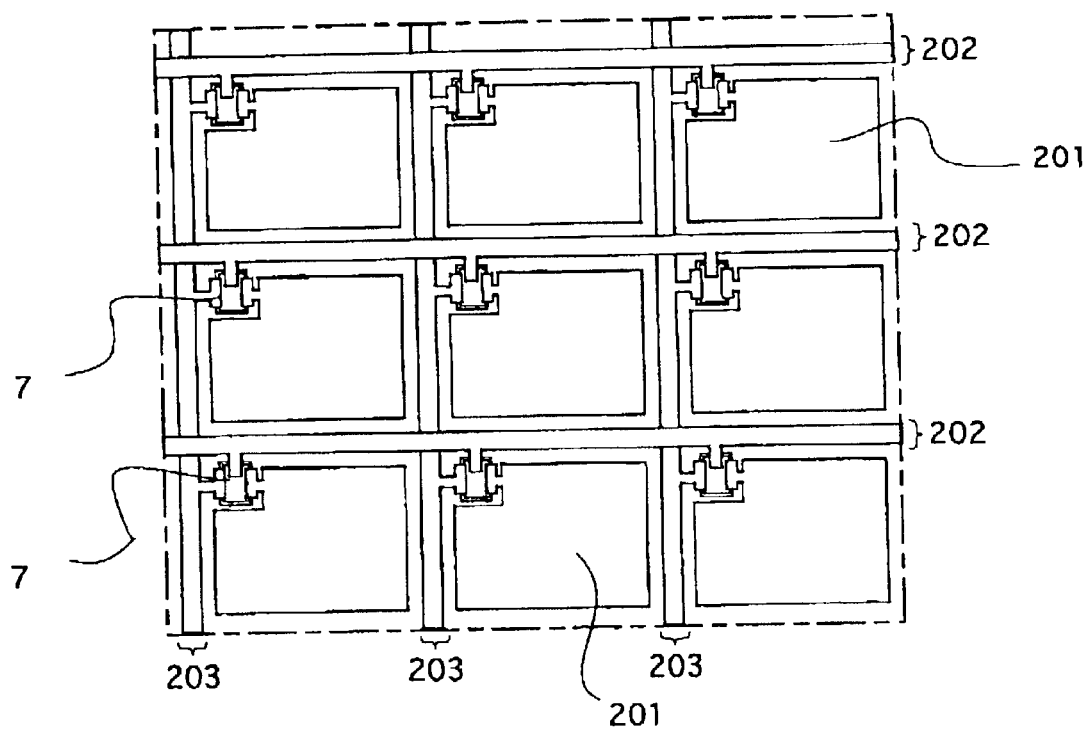
FIG. 22b is a plan view showing an essential portion of an array substrate used for the panel.

FIGS. 22a and 22b show an example where a TFT of the present embodiment is used as a switching element of a liquid crystal display panel.

A transparent pixel electrode 201 disposed in each pixel on an array substrate 200 is integrated with a drain electrode of the TFT. A scanning signal line 202 is connected to a gate electrode of the TFT serving as a switching element 7. An image signal line 203 serves as a source wiring line of the TFT. Source/drain connection of the TFT is controlled on/off by signals input into the TFT from a scanning line drive circuit (not shown in the figure) via the scanning signal line 202 When the source/drain connection is on, an image signal from the image signal line 203 is input into the transparent pixel electrode 201, thereby applying voltage between the transparent pixel electrode 201 and a transparent counter electrode 205 disposed to counter the electrode 201 via a liquid crystal layer 204. An electric field formed between the both electrodes changes an alignment of liquid crystal molecules in the liquid crystal layer 204 and a polarization direction of light irradiated from a back light 206 in a direction of arrows shown in the figure. Light that has been irradiated from the back light 206 and transmitted through a polarization plate 207a rotates depending on an alignment of the liquid crystal molecules while passing through the liquid crystal layer 204, and then transmits through a color filter layer 210 and a polarization plate 207b both disposed on a counter substrate 208. By this rotation, luminescence of light displayed on a pixel is adjusted. On each one surface of the array substrate 200 and the counter substrate 208 facing the liquid crystal layer 204, an alignment film 209 is formed to define an initial alignment of liquid crystal materials in the liquid crystal layer 204.

The use of a TFT of the present embodiment, in which on-current can be made large compared with a conventional TFT, makes it possible to shorten time required to write into pixels. In addition, the TFT of the present invention is more effective in a large screen panel having disposed therein a multiplicity of pixels. A non-display region having disposed therein a TFT can be made small, thereby making it possible to contribute to improvement in numerical apertures which is a problem in developing liquid crystal display devices.

Figure 23:
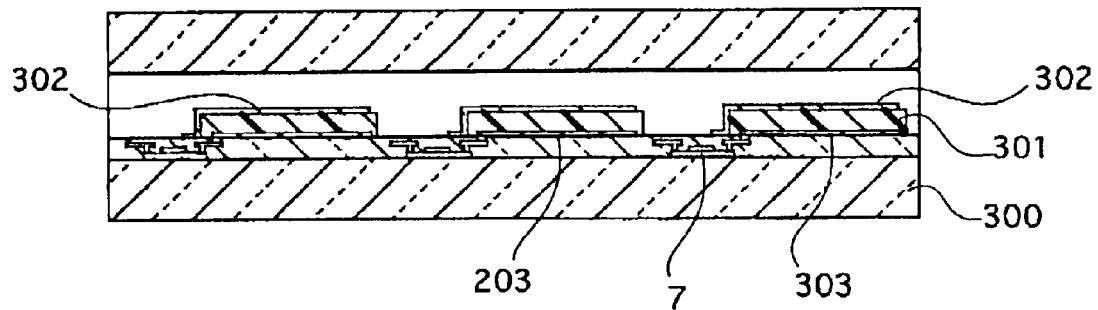
FIG. 23 shows a schematic longitudinal section of an essential portion of an organic EL display panel using a TFT as a switching element.

Likewise, an example of application to a switching element of an organic EL display panel will be described using FIG. 23.

On a glass substrate 300, an organic EL material layer 301 and a pair of electrodes 302 and 303 to sandwich the substrate 300 are disposed, and a TFT 7 disposed in each light emitting element controls on/off connection of voltage signals applied between the electrodes 302 and 303. By using a TFT of the present embodiment having a high current supply capacity as a switching element 7, sufficient current supply to the organic EL material layer 301 is made possible, thereby realizing high luminescence display.

It is to be understood that a thin film transistor element of the present invention can be used for controlling pixels of other display panels in addition to liquid crystal display panels and organic EL display panels.

In addition, the element can be used for a driving switch in a circuit portion of other devices.

Embodiment 2

In the present embodiment, an example of a TFT having an LDD (lightly-doped drain) structure and having a semiconductor thin film disposed in a same manner as that in EMBODIMENT 1 will be described.

Figure 3:
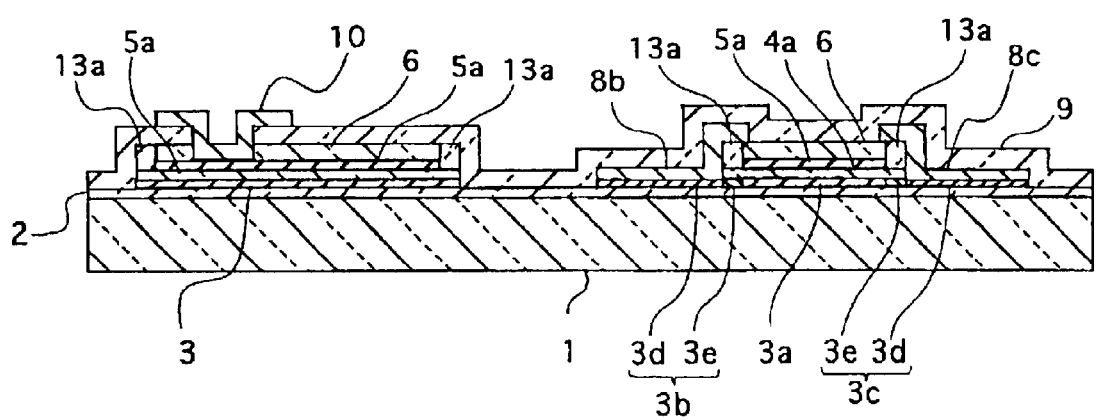
FIG. 3 is a schematic longitudinal section of a semiconductor element of another embodiment of the present invention.

FIG. 3 shows a TFT of the present embodiment. This TFT has approximately a same structure as that in EMBODIMENT 1. Nevertheless, in this TFT, each of a source region 3b and a drain region 3c are composed of a high concentration region 3d and a low concentration region 3e both having different impurity-ion concentrations from each other. High concentration regions 3d are disposed only below a source electrode wiring line 8b or a drain electrode wiring line 8c, and low concentration regions 3e are disposed only under an insulation wall 13a in a form of being sandwiched between a channel region 3a and the high concentration regions 3d. Accordingly, the semiconductor thin film 3 is connected to the source electrode wiring line 8b and a drain electrode wiring line 8 only at the high concentration regions 3d.

This TFT is produced in the following manner, for example.

Figure 4A:
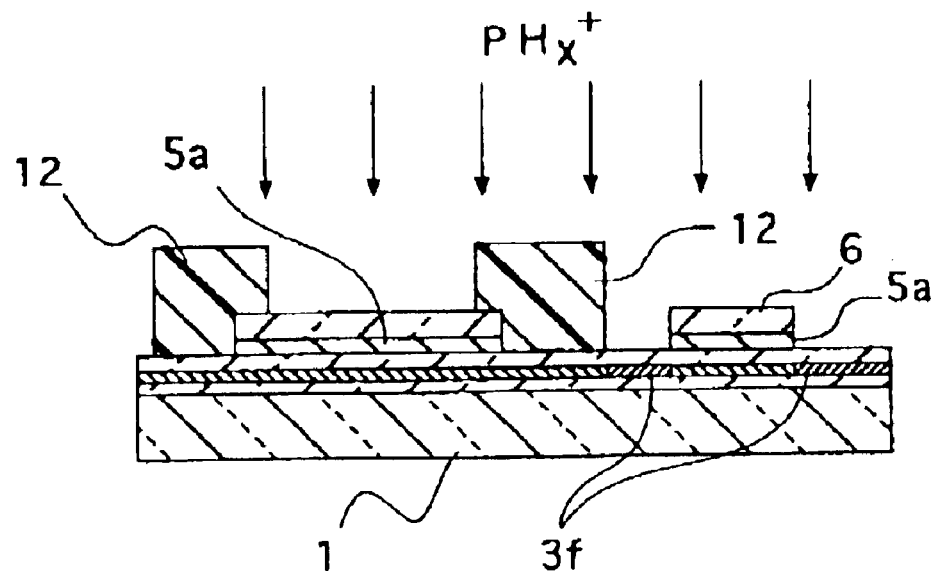
FIGS. 4a and 4b are schematic longitudinal sections showing the conditions of each step of the production process of the element.
Figure 4B:
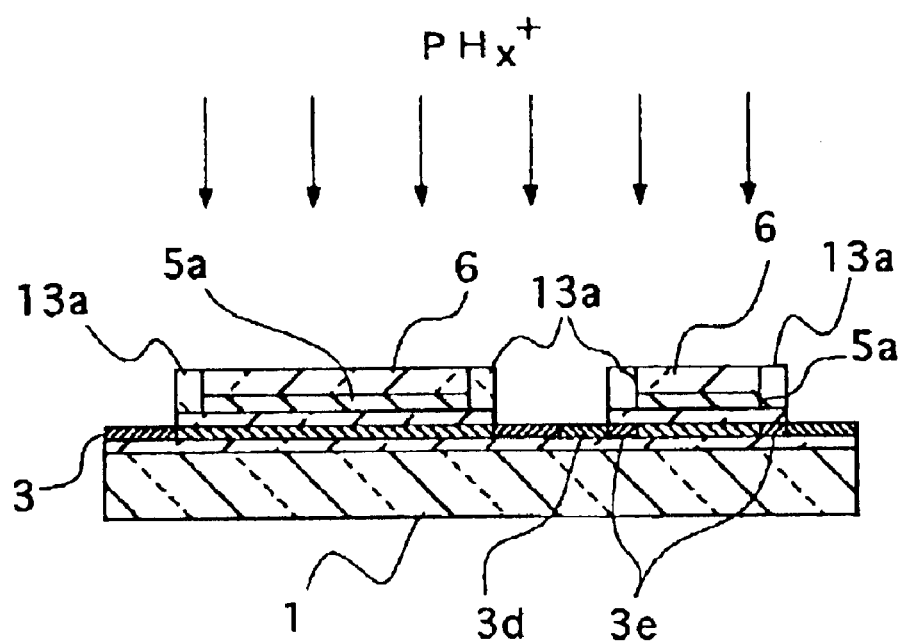

Similarly to EMBODIMENT 1, after forming a gate electrode 5a above an insulation substrate 1, ions are implanted into a semiconductor thin film 3 as shown in FIG. 4a, and an insulation wall 13a is formed. After forming the insulation wall 13a, as shown in FIG. 4b, a same type of ions as the previous are implanted into ion-implanted regions 3f of the semiconductor thin film 3 which are not covered by the gate electrode 5a and the insulation wall 13a, so that an ion concentration of the regions 3f is made higher. In this further ion-implanting, the gate electrode 5a and the insulation wall 13a serve as masks, and as shown in FIG. 4b, regions of the semiconductor thin film 3 which are extended beyond the insulation wall 13a have higher ion concentrations than those of regions covered by the insulation wall 13a. Therefore, by this further ion-implanting, the ion-implanted regions 3f are split into the high concentration regions 3d extended outside and the low concentration regions 3e covered by the insulation wall 13a.

Thereafter, similarly to EMBODIMENT 1, electrodes, wiring lines, and the like are formed, thus completing the TFT with an LDD structure shown in FIG. 3.

The TFT of the present embodiment with an LDD structure is more excellent in reliability since an electric field right under the gate electrode 5a are relieved.

According to the present embodiment, in forming low concentrations region and high concentration regions, a gate electrode and an insulation wall both formed in advance of the regions are used as masks, and therefore, it is not necessary to use resist patterns except for protecting part of regions. Accordingly, in a semiconductor element of the present embodiment, variations in element properties caused from positioning and size variations of masks in forming the regions are significantly small, compared with conventional production of a semiconductor element. In other words, according to the present embodiment, stable production of a thin film semiconductor with high reliability and stable properties is made possible.

Embodiment 3

In the present embodiment, an example of a TFT having an offset structure and having a semiconductor thin film disposed in a same manner as that in EMBODIMENT 1 will be described.

Figure 5:
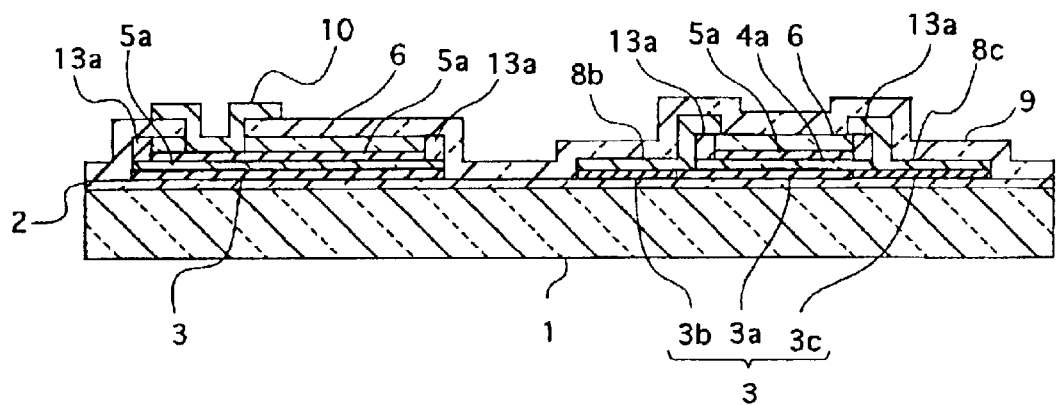
FIG. 5 is a schematic longitudinal section of a semiconductor element of still another embodiment of the present invention.

FIG. 5 shows a TFT of the present embodiment. This TFT has approximately a same structure as that in EMBODIMENT 1. Nevertheless, in the TFT of the present embodiment, a source region 3b and a drain region 3c are disposed only under a source electrode wiring line 8b and a drain electrode wiring line 8c, respectively. In regions below an insulation wall 13a, offset regions 3g not implanted with impurity ions are disposed. In other words, regions covered by a gate electrode 5a and the insulation wall 13a are not implanted with the impurity ions.

This TFT of the present embodiment is produced in the following manner, for example.

Figure 6A:
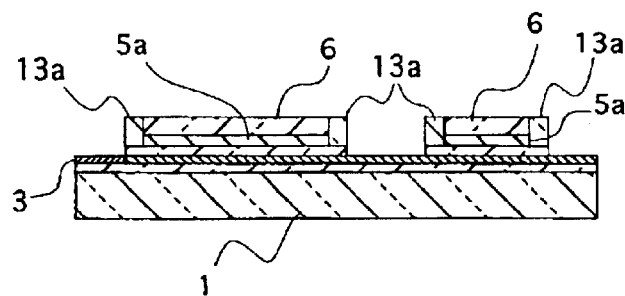
FIGS. 6a and 6b are schematic longitudinal sections showing the conditions of each step of the production process of the element.
Figure 6B:
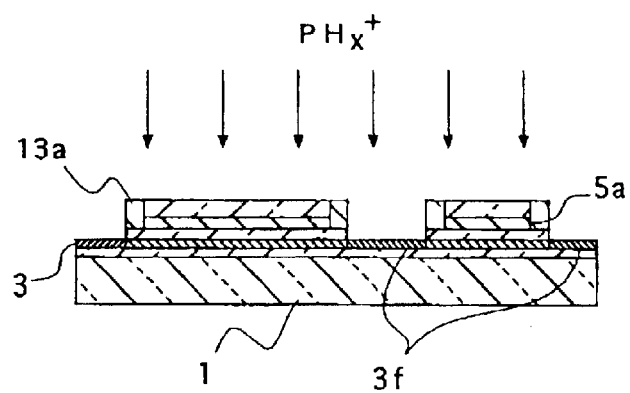

As shown in FIG. 6a, a conductive film 5 and the like are formed on a substrate 1 similarly to EMBODIMENT 1 and then processed by etching, thereby forming a gate electrode 5a. Thereafter, an insulation wall 13a is formed. Specifically, to cover entire one surface of the substrate 1 having disposed thereon a semiconductor thin film 3, an insulation film 13 composed of silicon oxide, for example, is formed and then processed by anisotropic etching (dry etching), whereby the insulation wall 13a to cover side surfaces of the gate electrode 5a is formed self-alignedly.

Using the formed insulation wall 13a and the gate electrode 5a (and a resist layer as required) as masks, impurity ions are implanted into the semiconductor thin film 3.

Thereafter, similarly to EMBODIMENT 1, the gate electrode 5a, the drain electrode wiring line 8c, and the like are formed, whereby a TFT having the offset region 3g below the insulation wall 13a is obtained.

According to the present embodiment, offset regions are self-alignedly formed, similarly to the formation of low concentration regions in EMBODIMENT 2. Accordingly, it is made possible to produce a TFT with a stable properties compared with a conventional offset TFT that requires resist patterns to form offset regions.

Embodiment 4

In the present embodiment, an example of a CMOS (Complementary Metal-Oxide Semiconductor) transistor in which a P channel transistor and an N channel transistor are disposed in parallel will be described.

A CMOS transistor is produced by implanting N type impurities and P type impurities into respective and predetermined regions of a semiconductor thin film in a method similar to EMBODIMENT 1.

Figure 7:
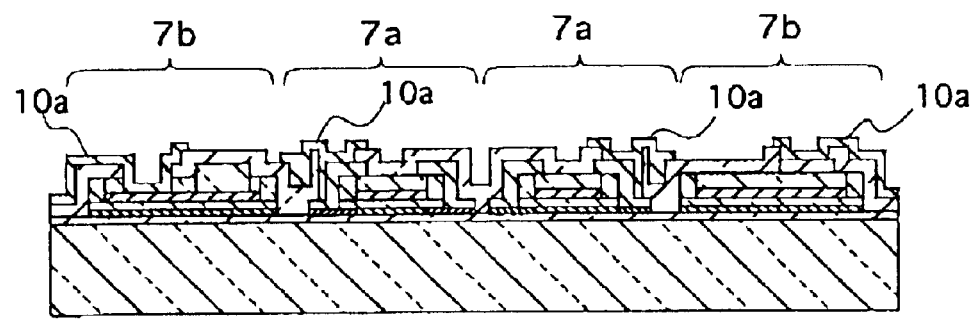
FIG. 7 is a schematic longitudinal section of a semiconductor element of yet another embodiment of the present invention.

FIG. 7 shows a CMOS transistor of the present embodiment.

P channel transistors 7a and N channel transistors 7b are identical except for impurities implanted into a semiconductor thin film 3 and have approximately same structures as a TFT of EMBODIMENT 1.

An example of a method of producing this CMOS transistor of the present embodiment will be described below.

Figure 8A:
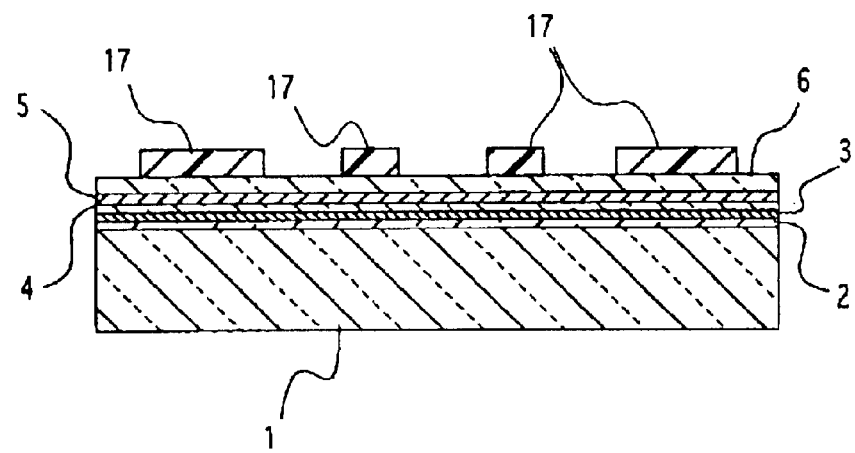
FIGS. 8a to 8e are schematic longitudinal sections showing the conditions of each step of the production process of the element.

Similarly to EMBODIMENT 1, an undercoat layer 2, a semiconductor thin film 3, an insulation film 4, a conductive film 5, and an insulation film 6 are formed on an insulation substrate 1, as shown in FIG. 8a, and the conductive film 5 is then processed into gate electrodes 5a by etching using resist layers 17 as masks.

Figure 8B:
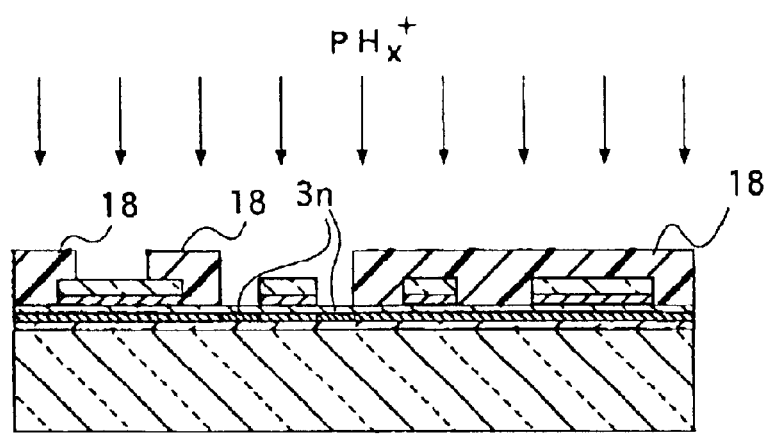
Figure 8C:
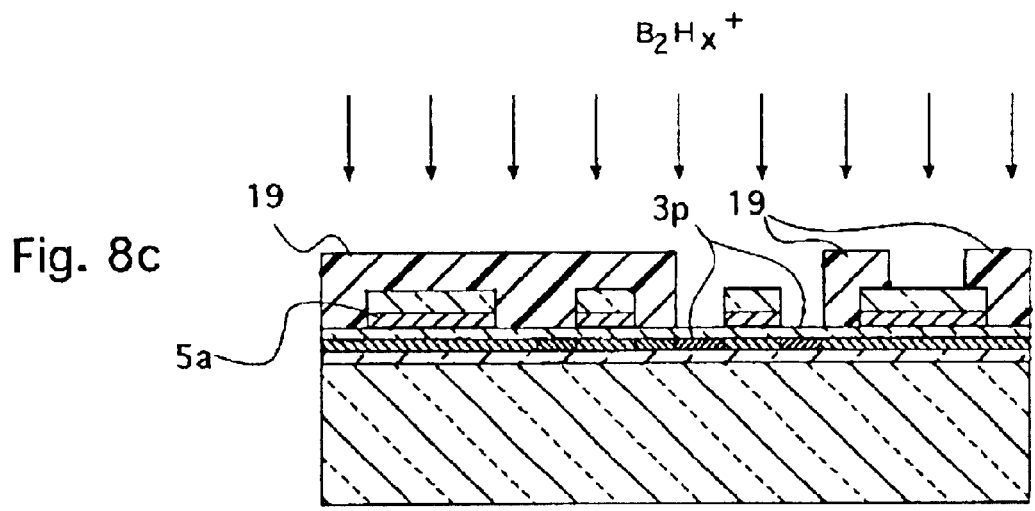

After forming the gate electrodes 5a, N type impurities and P type impurities are implanted into the semiconductor thin film 3. For example, as shown in FIG. 8b, resist layers 18 are formed on the substrate 1 so as to cover regions in which P channel transistors are to be formed and, as required, regions corresponding to side surfaces of channel regions 3a of an N channel transistor to be formed. Using the resist layers 18 as masks, the N type impurity ions are implanted into the semiconductor thin film 3, thereby forming N type impurity regions 3n Likewise, P type impurity regions 3p are formed. Specifically, resist layers 19 are formed on the substrate 1 so as to cover regions in which an N channel transistors are to be formed and, as required, regions corresponding to side surfaces of channel regions 3c of a P channel transistor to be formed. Using the resist layers 19 as masks, P type impurity ions such as boron are implanted into the semiconductor thin film 3.

Figure 8D:
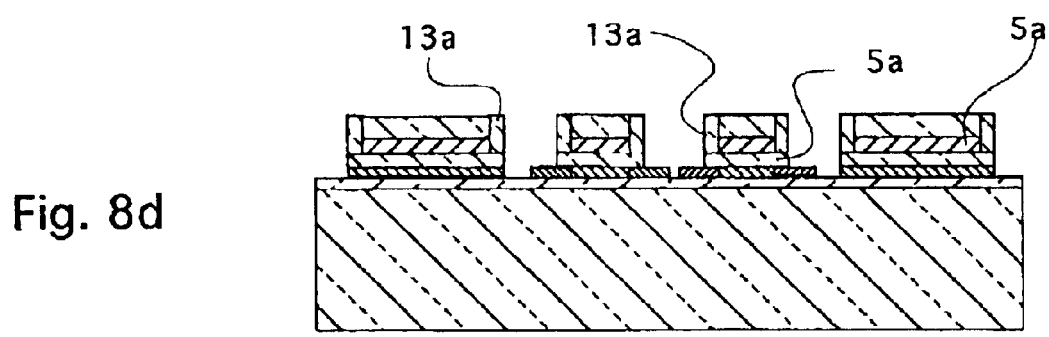

After forming the P type impurity regions 3p and N type impurity regions 3n in the semiconductor thin film 3, similarly to EMBBODIMENT 1, insulation walls 13a to surround gate electrodes 5a are formed, as shown in FIG. 8d. Specifically, to cover entire one surface of the substrate 1, an insulation film composed of silicon oxide, for example, is formed, and anisotropic etching is carried out on the insulation film.

Figure 8E:
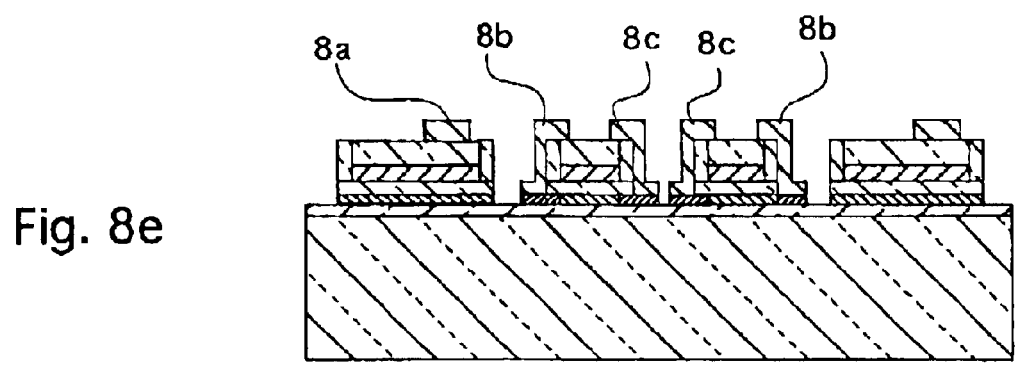

After forming the insulation walls 13a, wiring lines such as drain electrode wiring lines 8b and source electrode wiring lines 8c are formed, as shown in FIG. 8e. To cover the one surface of the substrate 1 having disposed thereon those films, a conductive film composed of titanium, for example, is formed. Thereafter, to form the gate electrodes 5a, the insulation walls 13a, and wiring lines, unnecessary regions of the conductive film are removed by etching using resist layers as masks, whereby wiring lines such as the drain electrode wiring lines 8b, the source electrode wiring lines 8c, and the like are formed. In addition, by this etching, the semiconductor thin film 3 is split.

After forming an insulation film 9 to cover the one surface of the substrate 1, source regions 3b and drain regions 3c of the semiconductor thin film 3 are activated by carrying out, for example, heat treatment on the substrate 1. A decrease in contact resistance is attempted between the source regions 3b and source electrodes 5b and between the drain regions 3c and drain electrode wiring lines 8c.

Next, contact holes 9a are formed in the insulation film 9, and signal wiring lines 10 connected to electrodes such as scanning signal lines and image signal lines, and other signal lines are formed. Thus, the CMOS transistor shown in FIG. 7 is obtained.

Note that an N channel transistor and a P channel transistor may have an LDD structure as in EMBODIMENT 2 or an offset structure as in EMBODIMENT 3.

Embodiment 5-1

Figure 9A:
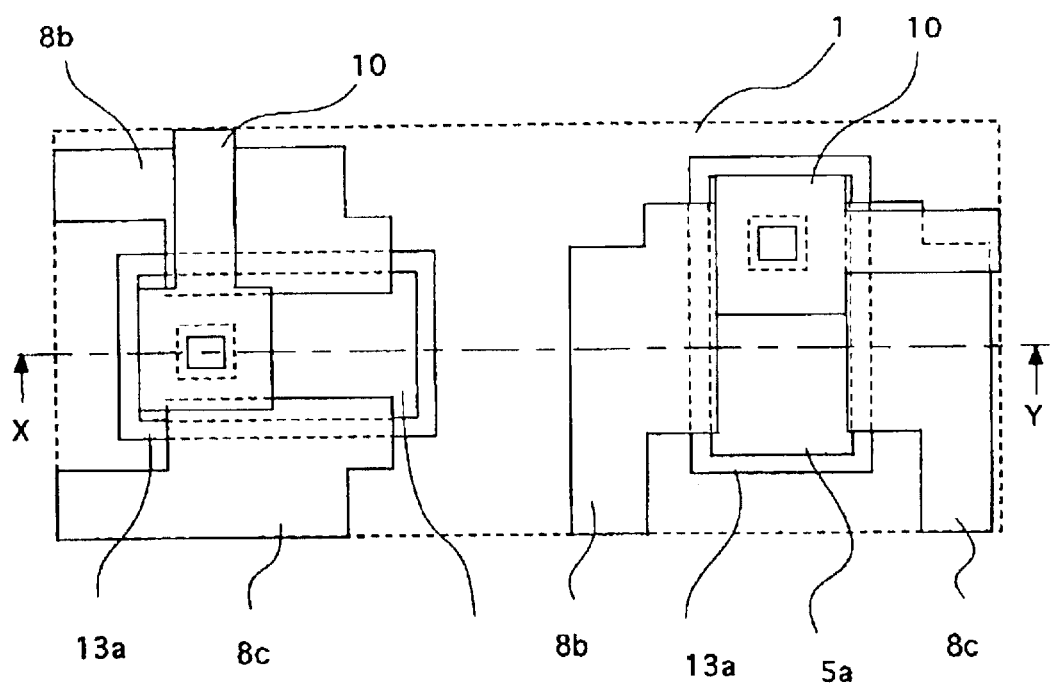
FIG. 9a is a plan view of a semiconductor element of still another embodiment of the present invention, and 9b is a schematic longitudinal section of the element.
Figure 9B:
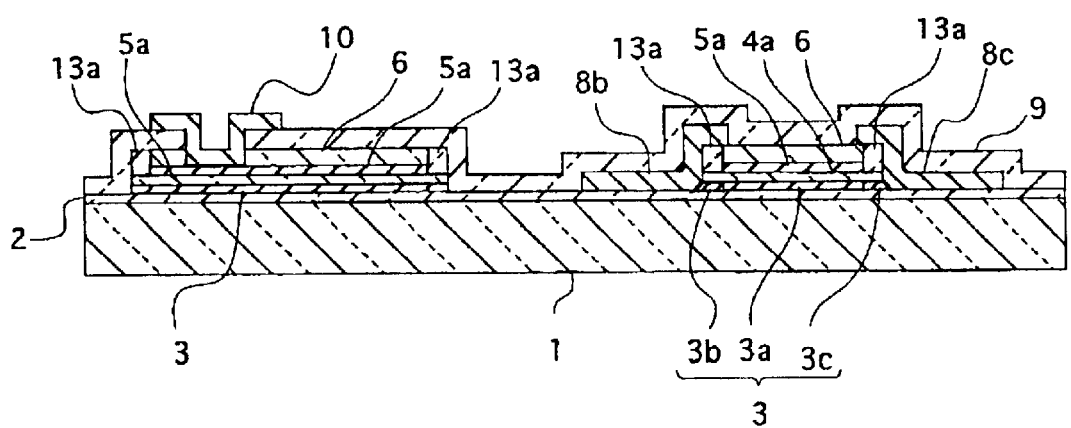

FIGS. 9a and 9b show a thin film semiconductor element of the present embodiment.

On a surface of an insulation substrate 1, a semiconductor thin film 3 composed of polycrystal silicon is formed.

The semiconductor thin film 3a includes a channel region (active regions) 3 not containing impurities, and a source region 3b and a drain region 3c implanted with phophorus as N type impurities.

An undercoat layer 2 sandwiched between the substrate 1 and the semiconductor thin film 3 prevents impurity diffusion from the substrate 1 to the semiconductor thin film 3 and occurrence of lattice defects on a surface of the channel region 3a.

Above an upper surface of the semiconductor thin film 3, a gate electrode 5a is formed to cover almost an entire surface of the channel region 3a via a gate insulation film 4a. An upper surface of the gate electrode 5a is covered by an insulation film 6, and side surfaces of the electrode 5a are covered by an insulation wall 13a composed of silicon oxide. A width of the insulation wall 13a is substantially equal to that of the semiconductor thin film 3 disposed below the wall 13a or that of the gate insulation film 4a.

The source region 3b and the drain region 3c both disposed at a pair of edge portions of the semiconductor thin film 3 are connected to a source electrode wiring line 8b and a drain electrode wiring line 8c, respectively, at each slanted edge surface of the wiring lines. To cover them, an insulation film 9 is formed. The source electrode wiring line 8b and the drain electrode wiring line 8c are electrically insulated from the gate electrode 5a by the insulation film 6 and the insulation wall 13a. A signal wiring line 10 is electrically connected to the gate wiring line 5a at a contact hole 9a formed in the insulation film 9 above the gate electrode 5a.

A length of the channel region 3a is substantially equal to that of the gate electrode 5a.

This TFT of the present invention is produced in the following manner, for example.

Figure 10A:
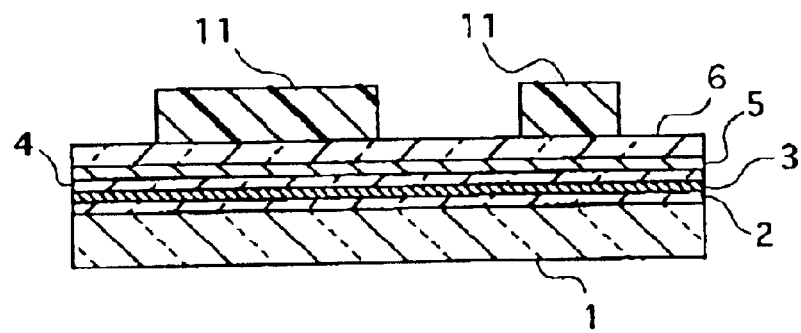
FIGS. 10a to 10h are schematic longitudinal sections showing the conditions of each step of the production process of the element.
Figure 10B:
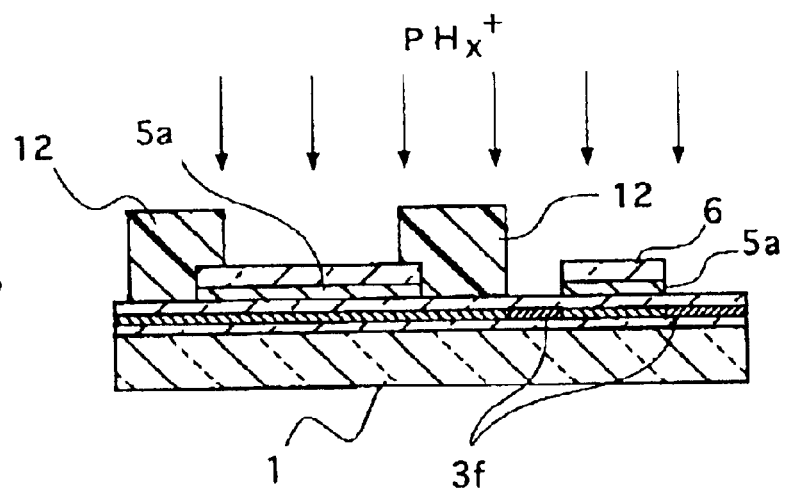

As shown in FIG. 10a, on an insulation substrate 1 composed of, for example, glass, an undercoat layer 2 composed of silicon oxide is formed, and thereover a semiconductor thin film 3 composed of polycrystal silicon is formed. Thereafter, to cover the semiconductor thin film 3, an insulation film 4 composed of silicon oxide and a conductive film 5 composed of a molybdenum tungsten alloy are formed. Next, a resist layer 11 is formed to cover a region in which a channel region (active region) 3a of a TFT is to be disposed. Using the resist layer 11 a mask, the insulation film 4 and the conductive film 5 are etched. By this etching, the conductive film 5 is processed into a gate electrode 5a of a desired TFT, and an insulation film 6 covering the conductive film 5 is processed into a similar shape.

After removing the resist layer 11, impurity ions are implanted into predetermined regions of the semiconductor thin film 3. A region of the semiconductor thin film 3 of which a surface is covered by the gate electrode 5a is not implanted with ions because the gate electrode 5a serves as a mask. Regions implanted with ions (ion-implanted regions 3f) are processed into a source region 3b and a drain region 3c to sandwich the channel region 3a. Accordingly, in advance of ion-implanting, resist layers 12 are preferably formed to cover a pair of parallel end portions of the rectangular gate electrode 5a in order to avoid a source/drain short circuit in the obtained TFT. Using the resist layers 12 and the gate electrode 5a as masks, phosphorus is implanted, as N type impurities, into the semiconductor thin film 3 by a plasma doping method using a phosphine gas ($PH_3$).

Figure 10C:
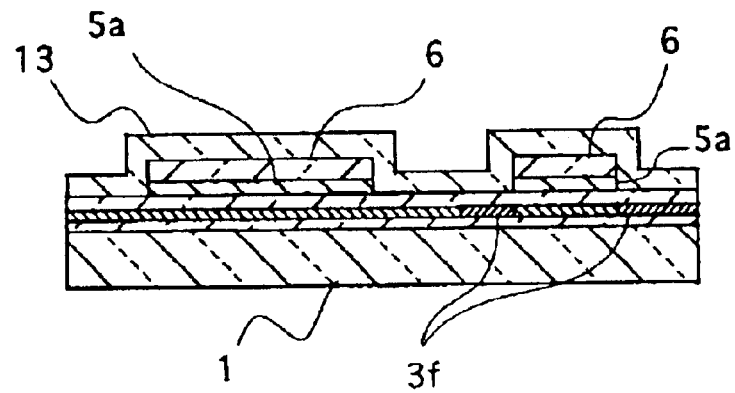
Figure 10D:
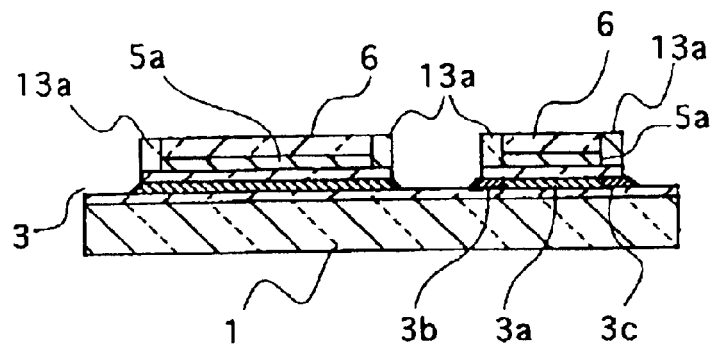

After removing the resist layers 12, as shown in FIG. 10c, to cover entire one surface of the substrate 1 having disposed thereon the semiconductor thin film 3, an insulation film 13 composed of silicon oxide, for example, is formed. Although flat regions of the formed insulation film 13 have a uniform thickness, portions corresponding to end portions of the gate electrode 5a are thicker than the flat regions, as shown in FIG. 10c. When anisotropic etching (dry etching) is carried out in a normal direction of the substrate 1, only portions of the insulation film 13 around the gate electrode 5a remain, whereby an insulation wall 13a to cover side surfaces of the gate electrode 5a is formed. By this etching, as shown in FIG. 10d, regions of the insulation film 4 on which the gate electrode 5a is not disposed are removed, whereby a gate insulation film 4a is formed and portions of the semiconductor thin film 3 disposed under the regions of the insulation film 4 are removed. In other words, the semiconductor thin film 3 is self-aligningly processed into a shape approximately equal to an outer shape of the insulation wall 13a disposed around the gate electrode 5a. Thereby, the semiconductor thin film 3 is split into the source region 3b, the drain region 3c, and the channel region 3a, the source region 3b and the drain region 3c being implanted with ions, and the channel region 3a being sandwiched between the regions 3b and 3c. Here, as shown in FIG. 10d, edge portions of a bottom side of the processed semiconductor thin film 3 are extended beyond the insulation wall 13a. In other words, the semiconductor thin film 3 is processed to have a trapezoidal cross section.

Figure 10E:
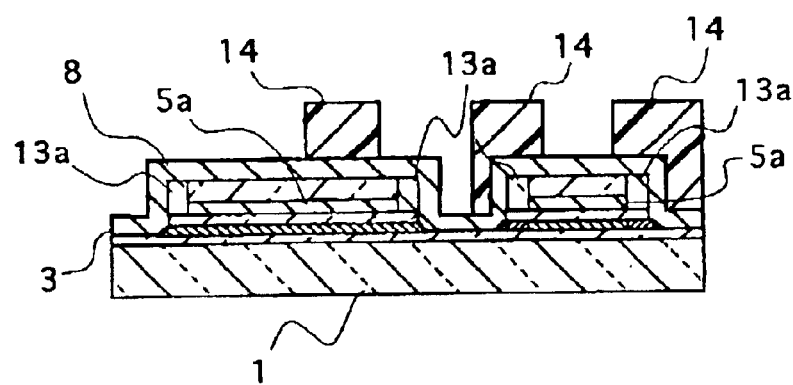
Figure 10F:
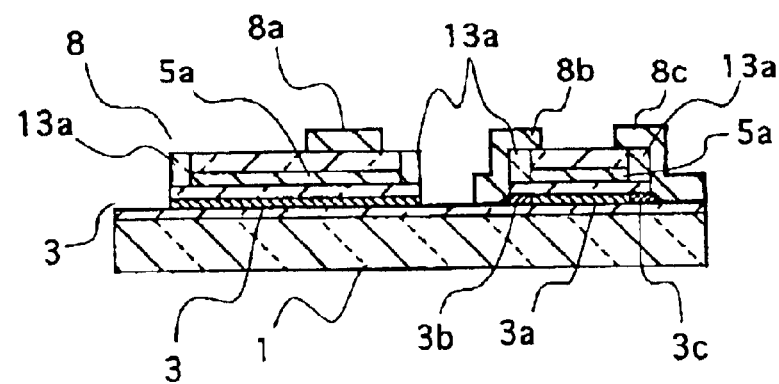

After processing the semiconductor thin film 3, wiring lines such as a source electrode wiring line 8b and a drain electrode wiring line 8c are formed. As shown in FIG. 10e, to cover the one surface of the substrate 1 having disposed thereon those films, a conductive film 8 composed of titanium, for example, is formed. To cover regions of the conductive film 8 to be processed into wiring lines, resist layers 14 are formed, and unnecessary regions of the conductive film 8 are removed by etching. Thereby, as shown in FIG. 10f, scanning signal lines such as a signal wiring line 8a, and the source electrode wiring line 8b, the drain electrode wiring line 8c, and the like are formed. By this etching, exposed extension edges of the semiconductor thin film 3 are removed. Exposed extension edge portions of the source region 3b and the drain region 3c are connected to the source electrode wiring line 8b and the drain electrode wiring line 8c, respectively. The slanted side surfaces of the semiconductor thin film 3 allow to secure sufficient contact areas between the source region 3b and the source electrode wiring line 8b and between the drain region 3c and the drain electrode wiring line 8c, thereby obtaining stable electric contact between the regions and the wiring lines.

Figure 10G:
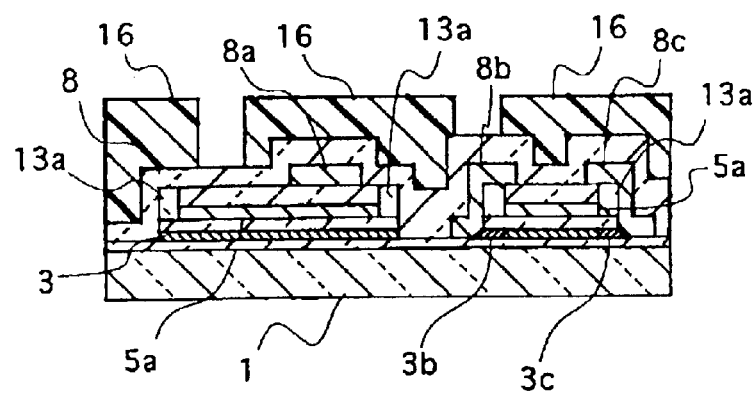
Figure 10H:
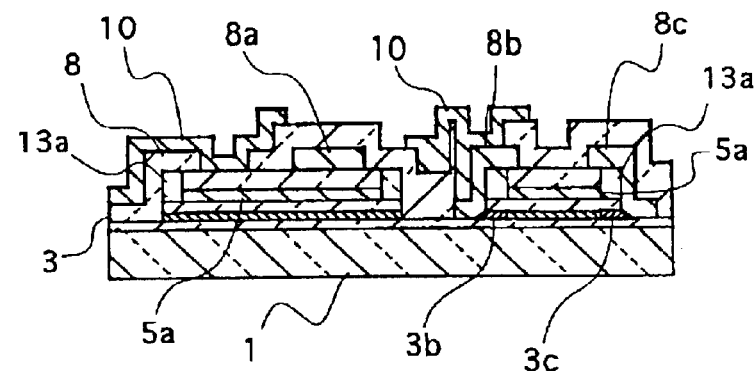

After removing the resist layers 14, as shown in FIG. 10g, to cover the one surface of the substrate 1, an insulation layer 9 composed of silicon oxide, for example, is formed.

After forming the insulation film 9, the source region 3b and the drain region 3c of the semiconductor thin film 3 both implanted with phosphorus are activated by carrying out heat treatment on the substrate 1 at, for example, 400° C. to 600° C. In addition, a decrease in contact resistance is attempted between the source region 3b and the source electrode wiring line 8b and between the drain region 3c and the drain electrode wiring line 8c.

Next, other signal wiring lines such as a scanning signal line and an image signal line are formed.

As shown in FIG. 10g, a resist layer 16 is formed with a pattern having an aperture in a region at which wiring lines and electrodes are to be connected. By etching using the resist layer 16 as masks, exposed regions of the insulation film 9 are removed, thus forming a contact hole 9a.

Subsequently, a conductive film composed of aluminum is formed on the entire one surface of the substrate 1 and processed into a predetermined pattern, thus forming a signal wiring line 10.

Thus, the TFT shown in FIGS. 9a and 9b is obtained.

By the present embodiment as well, a semiconductor thin film is formed self-alignily. Specifically, a region to be processed into a channel region (or regions to be processed into source/drain regions) is defined by a shape of a gate electrode. In addition, a shape of the semiconductor thin film is defined by a shape of an insulation wall surrounding the gate electrode. The insulation wall is also formed self-alignily. According to the present invention, these TFT components are formed self-alignily, thereby making it possible to produce a semiconductor element with stable properties.

According to the present invention, a distance between a gate electrode and source/drain electrodes is defined by a thin insulation wall, thereby making it possible to shorten the distance compared with a conventional element. When an element is on, resistant components in source/drain regions is minimized, whereby source/drain resistance can be made low, and on-current can be made high compared with a conventional element. In addition, sufficient contact areas are secured between the source/drain regions and electrode materials, thereby reducing contact resistance between the regions and the materials compared with a conventional element.

Moreover, an occupancy area of an element can be made smaller than that of a conventional element, making it possible to dispose the element with high density. In addition, using TFTs of the present invention as switching elements for controlling each pixel of liquid crystal display panels, organic EL display panels, and the like contributes to improvement in numerical apertures of the display panel pixels and to high definition displays.

According to the present invention, production process of an element is simplified to a great extent. For example, unlike a conventional element, it is needless to form a contact hole in an insulation film between source/drain regions and electrode materials in order to connect them electrically.

Embodiment 5-2

In the present embodiment, a more efficient production method of a thin film semiconductor element similar to EMBODIMENT 5-1 will be described.

Figure 11A:
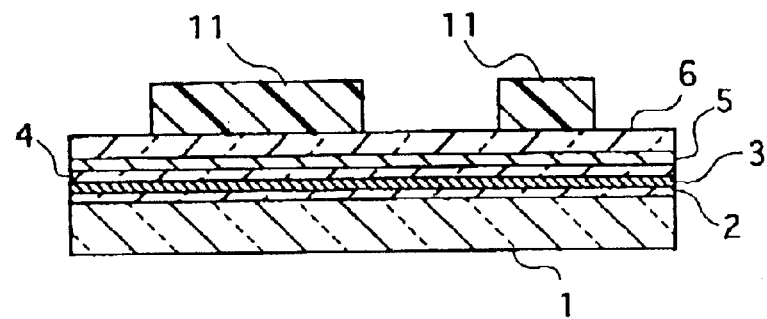
FIGS. 11a and 11b are schematic longitudinal sections showing the conditions of each step of the production process of a semiconductor element of yet another embodiment of the present invention.
Figure 11B:
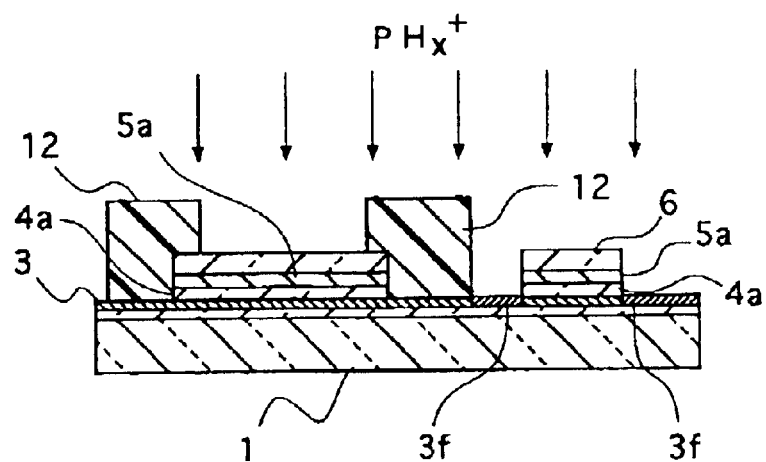

In the present embodiment, ions are implanted into a semiconductor thin film 3 via an insulation film formed on an upper surface of the semiconductor thin film 3. Specifically, as shown in FIG. 11a, when processing a conductive film 5 formed above an insulation substrate 1 into a gate electrode 5a by etching similarly to EMBODIMENT 5-1, exposed regions of an insulation film 6, regions of the conductive film 5 below the film 6, and regions of an insulation film 4 below the conductive film 5 are removed simultaneously. By this etching, regions of the semiconductor thin film 3 not covered by resist layers are exposed as shown in FIG. 11b.

Thereafter, as shown in FIG. 11c, ions are implanted directly into the semiconductor thin film 3 without via the insulation film 4. By implanting the ions without via the insulation film 4, ion-implanting with high concentration and promotion of high efficiency can be carried out. In the present embodiment, in contrast to EMBODIMENT 5-1 in which thickness variations of an insulation film 4 formed on an upper surface of a semiconductor thin film 3 cause concentration variations of ions implanted into the thin film 3, ions are directly implanted into the semiconductor thin film 3, whereby stable production of semiconductor elements with small property variations is made possible.

Embodiment 6

In the present embodiment, an example a TFT in which source/drain regions of a semiconductor thin film are connected to respective electrode wiring lines at each edge surface similarly to the above-described embodiment, and having an LDD (lightly-doped drain) structure will be described.

Figure 12:
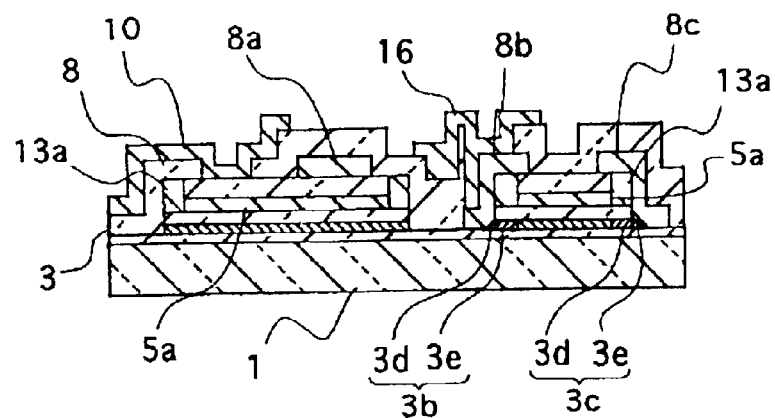
FIG. 12 is a schematic longitudinal section of a semiconductor element of still another embodiment of the present invention.

A TFT of the present embodiment is shown in FIG. 12. This TFT has approximately a same structure as that in EMBODIMENT 5-1. Nevertheless, in the TFT of the present embodiment, each of a source region 3b and a drain region 3c of a semiconductor thin film 3 are composed a high concentration region 3d and a low concentration region 3e different from each other in impurity ion concentrations. High concentration regions 3d are disposed only in regions of the semiconductor thin film 3 which are extended beyond an insulation wall 13a. Low concentration regions 3e are disposed only below the insulation wall 13a to be sandwiched between a channel region and the high concentration regions 3d. The semiconductor thin film 3 is connected to a source electrode wiring line 8b and a drain electrode wiring line 8 only at the high concentration regions 3d.

This TFT is produced in the following manner, for example.

Figure 13A:
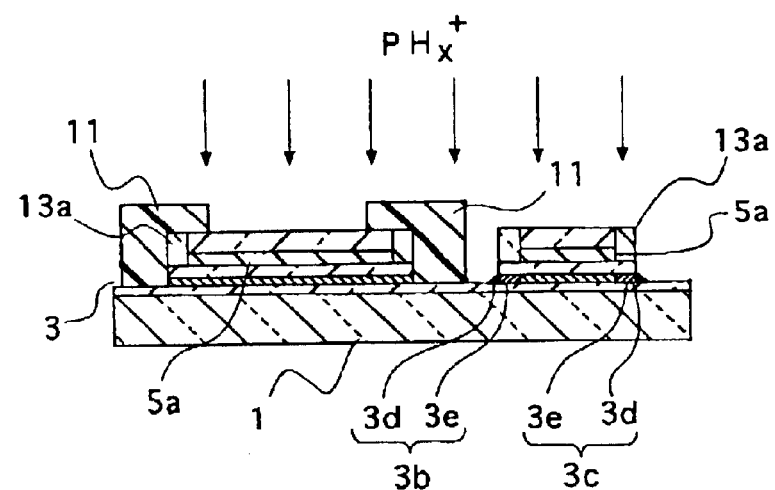
FIGS. 13a and 13b are schematic longitudinal sections showing the conditions of each step of the production process of the element.

Similarly to EMBODIMENT 5-1, a gate electrodes 5 is formed above a substrate 1, ions are implanted into a semiconductor thin film 3, and an insulation wall 13a is formed as shown in FIG. 13a.

Figure 13B:
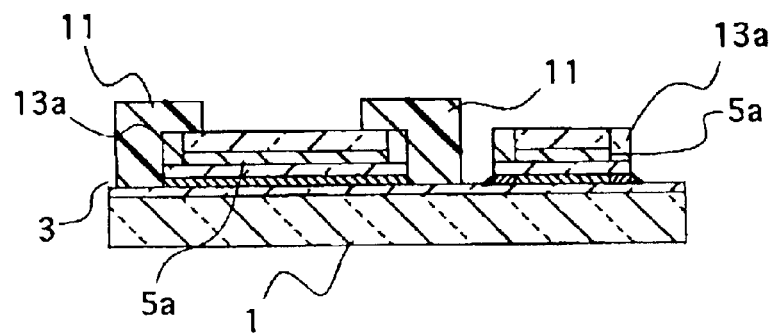

Next, using same resist layers 11 as those used in the previous ion-implanting, a same type of ion as that used in the previous are implanted into regions of the semiconductor thin film 3 which are extended beyond the insulation wall 13a by a plasma doping method, for example. The regions of the semiconductor thin film 3 extended beyond the insulation wall 13a and regions of the thin film 3 right below the insulation wall 13a have already been implanted with ions. In this further ion-implanting, the insulation wall 13a serves as a mask, and as shown in FIG. 13b, only the regions of the semiconductor thin film extended beyond the insulation wall are further implanted with ions, whereby the high concentration regions 3d and the low concentration regions 3e are formed in the source region 3b and the drain region 3c.

Thereafter, similarly to EMBODIMENT 1, electrodes, wiring lines, and the like are formed, thus obtaining a semiconductor element with an LDD structure as shown in FIG. 12.

An MIS transistor of the present embodiment with an LDD structure, in which an electric field right below a gate electrode 5 is relieved compared with EMBODIMENT 5-1, is more excellent in reliability.

According to the present embodiment, when forming low concentration regions and high concentration regions, a gate electrode and an insulation wall both formed in advance of the regions are used as masks, thereby making it needless to use resist patterns except for protecting part of regions. Accordingly, in a semiconductor element of the present embodiment, variations in element properties caused from positioning and size variations of masks in forming the regions are significantly small compared with conventional production of a semiconductor element. In other words, according to the present embodiment, a stable production of a thin film semiconductor with high reliability and stable properties is made possible.

Note that, in advance of the above-described ion-implanting, a gate insulation film may be formed as in EMBODIMENT 5-2.

Embodiment 7

In the present embodiment, another example of a TFT with an LDD structure will be described.

In the present embodiment, a source region and a drain region of a semiconductor element in EMBODIMENT 5-1 and EMBODIMENT 5-2 are made low concentration regions, and a source electrode wiring line and a drain wiring line are made high concentration regions, thus forming an LDD structure.

Figure 14:
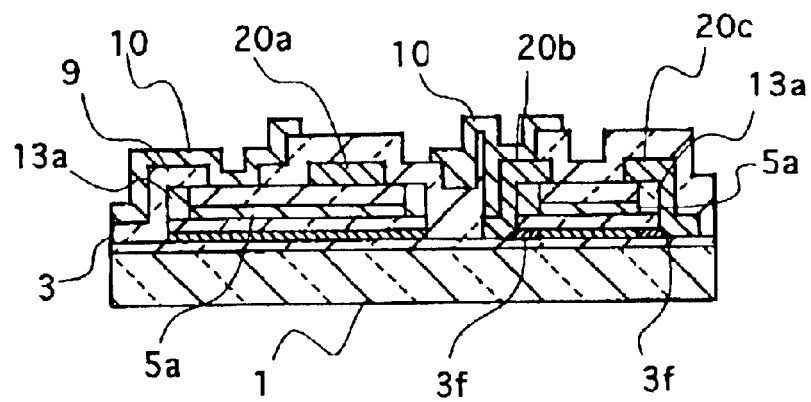
FIG. 14 is a schematic longitudinal section of a semiconductor element of yet another embodiment of the present invention.

FIG. 14 shows a TFT of the present embodiment. In this TFT, ion-implanted regions 3h which are at edge portions of a semiconductor thin film 3 and implanted with ions serve as low concentration regions of an LDD structure, and signal wiring lines 20b and 20c connected to the regions serve as high concentration regions of an LDD structure.

The TFT of the present embodiment is produced in the following manner, for example.

Figure 15A:
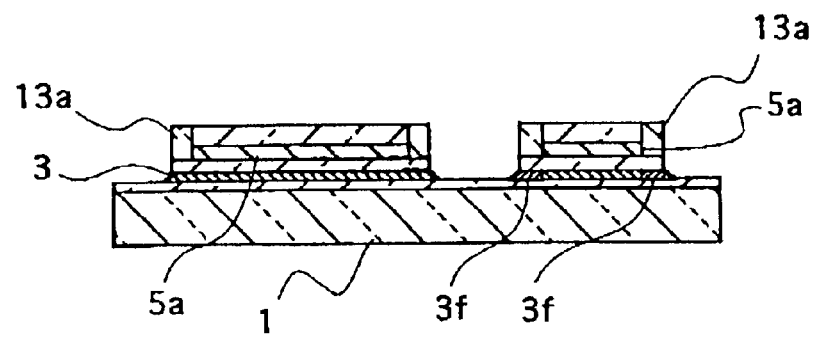
FIGS. 15a and 15b are schematic longitudinal sections showing the conditions of each step of the production process of the element.

Similarly to EMBODIMENTS 5-1, a gate electrode 5a is formed above a substrate 1, ions are implanted into a semiconductor thin film 3, thus forming ion-implanted regions 3f. Thereafter, an insulation wall 13a is formed as shown in FIG. 15a, and the semiconductor thin film 3 is split.

Figure 15B:
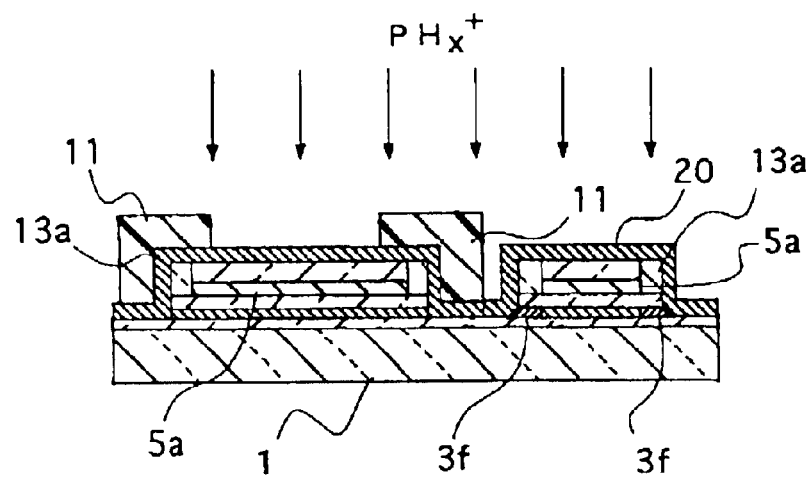

Thereafter, as shown in FIG. 15b, to cover a surface of the substrate 1, a semiconductor thin film 23 composed of titanium silicide (Ti Si), for example, is formed. Next, using resist layers 24 as masks, a same type of ions as those used in the previous ion-implanting of the semiconductor thin film 3 are implanted into the semiconductor thin film 23 by, for example, a plasma doping method, the resist layers 24 being formed to protect side surfaces of a channel region and the like. Here, a concentration of ions implanted into the semiconductor thin film 23 is made higher than that of the ion-implanted regions 3f of the semiconductor thin film 3.

The semiconductor thin film 23 implanted with the ions is processed into signal wiring lines 20b and 20c and other wiring lines. The signal wiring lines 20b and 20c are connected to the ion-implanted regions 3f of the semiconductor thin film 3 with a low ion concentration, whereby an LDD structure with high concentration regions and low concentration regions is obtained. After processing the semiconductor thin film 23, an insulation film is formed similarly to the above-described embodiment, and heat treatment at 400° C. to 600° C. is carried out to diffuse the ions implanted into the wiring lines 20b and 20c to edge portions of the semiconductor thin film 3, the wiring lines being formed to contact with the semiconductor thin film 3.

Thereafter, a contact hole is formed, and the signal wiring lines are formed into predetermined patterns, thus obtaining the TFT with an LDD structure.

Embodiment 8

In the present embodiment, an example of a TFT in which each edge surface of source/drain regions of a semiconductor thin film is connected to electrode wiring lines and having an offset structure.

Figure 16:
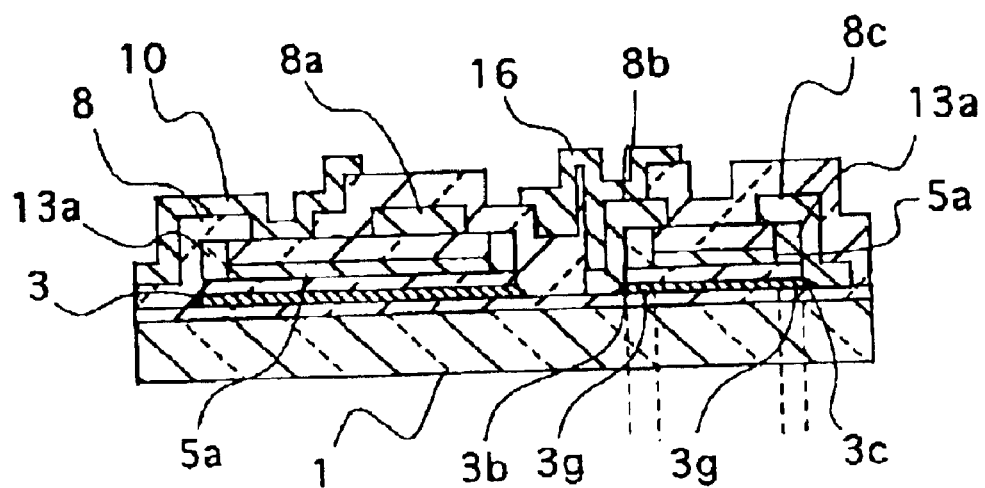
FIG. 16 is a schematic longitudinal section of a semiconductor element of still another embodiment of the present invention.

A TFT of the present embodiment is shown in FIG. 16. This TFT has approximately a same structure as that in EMBODIMENTS 5-1. Nevertheless, in the TFT of the present embodiment, a source region 3b and a drain region 3c of a semiconductor thin film 3 are disposed only in a pair of edge portions of a semiconductor thin film which are extended beyond an insulation wall 13a, and in regions below the insulation wall 13a, offset regions 3g not implanted with impurity ions are disposed. In other words, regions covered by a gate electrode 6a and the insulation wall 13a are not implanted with the impurity ions.

This TFT of the present embodiment is produced in the following manner, for example.

Figure 17:
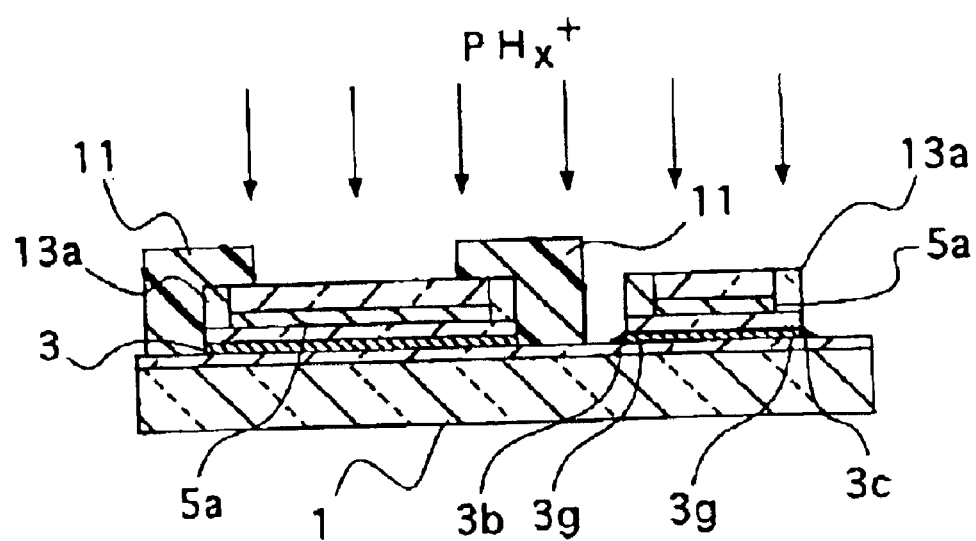
FIG. 17 is a schematic longitudinal section showing the conditions of each step of the production process of the element.

Similarly to EMBODIMENTS 5-1, a gate electrode 5a is formed above a substrate 1, and an insulation wall 13a is formed. In anisotropic etching to form the insulation wall 13a, a semiconductor thin film 3 is split. On such occasion, edge portions of the split semiconductor thin film 3 are extended beyond the insulation wall 13a as shown in FIG. 17. Using the insulation wall 13a and the gate electrode 5a (and resist layers 11 as required) as masks, impurity ions are implanted into the semiconductor thin film 3. In other words, the edge portions extended beyond the insulation wall 13a are implanted with the ions.

Thereafter, a gate electrode wiring line, a drain electrode wiring line, and the like are formed similarly to EMBODIMENTS 5-1, thus obtaining a TFT with offset regions 3g under the insulation wall 13a.

According to the present embodiment, offset regions are formed self-aligningly, thereby making it possible to produce a TFT with stable properties compared with a conventional offset TFT in which resist patters are used for forming offset regions.

Embodiment 9

An example of a CMOS transistor using a TFT in which each edge surface of source/drain regions of a semiconductor thin film is connected to respective electrode wiring lines will be described.

Figure 18:
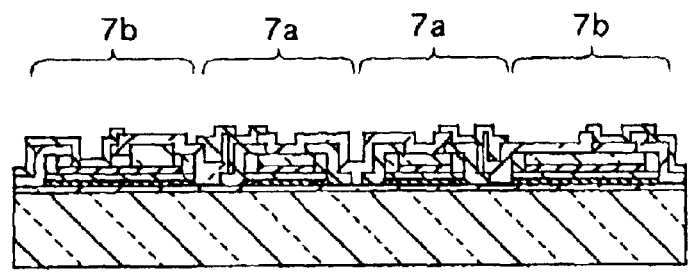
FIG. 18 is a schematic longitudinal section of a semiconductor element of yet another embodiment of the present invention.

FIG. 18 shows a CMOS transistor of the present embodiment.

P channel transistors 7a and N channel transistors 7b are identical except for implanted impurities. These transistors have approximately a same structure as a TFT in EMBODIMENT 1.

An example of a production method of a CMOS transistor of the present embodiment is shown below.

Figure 19A:
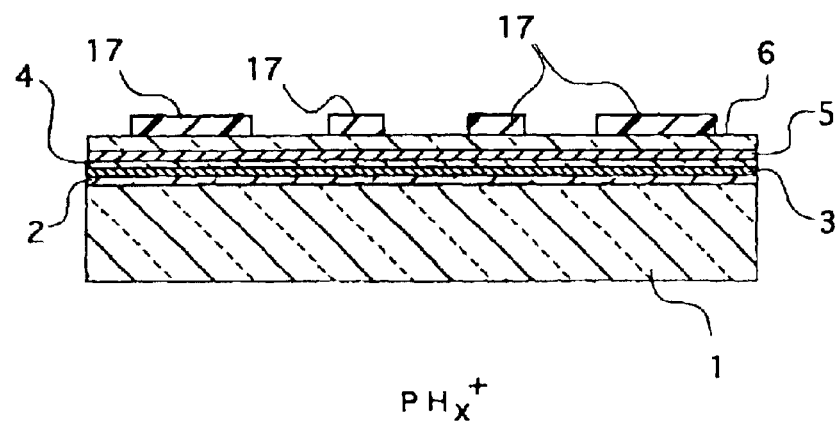
FIGS. 19a to 19e are schematic longitudinal sections showing the conditions of each step of the production process of the element.

Similarly to EMBODIMENT 5-1, as shown in FIG. 19a, an undercoat layer 2, a semiconductor thin film 3, an insulation film 4, a conductive film 5, and an insulation film 6 are formed on an insulation substrate 1. By etching using resist layers 17 as masks, the conductive film 5 is processed into gate electrodes 5a.

Figure 19B:
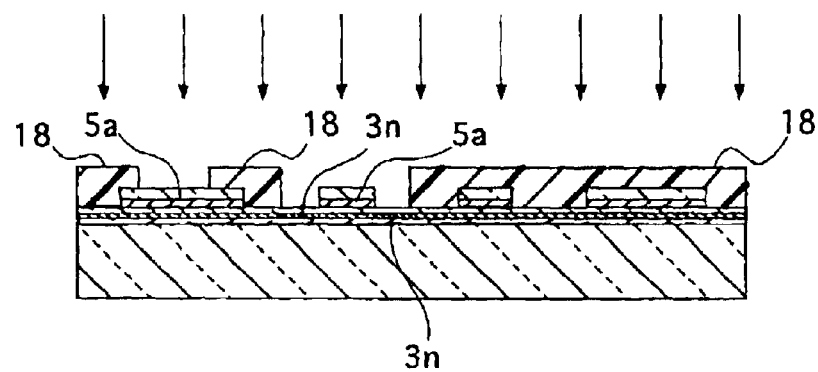
Figure 19C:
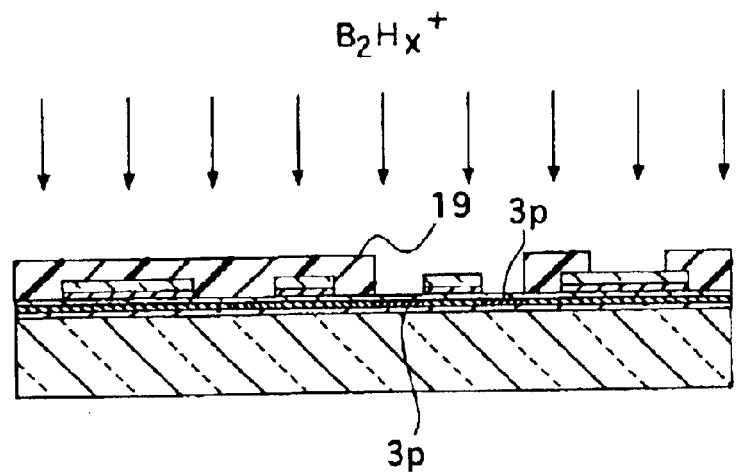

After forming the gate electrodes 5a, N type impurities and P type impurities are implanted into the semiconductor thin film 3. For example, as shown in FIG. 19b, resist layers 18 are formed above the substrate 1 so as to cover regions in which the P channel transistors are to be formed and, as required, regions corresponding to side faces of channel regions 3a of the N channel transistors to be formed. Using the resist layers 18 as masks, the N type impurity ions are implanted into the semiconductor thin film 3, thereby forming N type impurity regions 3n. Likewise, P type impurity regions 3p are formed. Specifically, as shown in FIG. 19c, resist layers 19 are formed above the substrate 1 so as to cover regions in which N channel transistors are to be formed, and as necessary, to cover regions corresponding to side faces of channel regions 3c of P channel transistors to be formed. Using the resist layers 19 as masks, P type impurity ions such as boron are implanted into the semiconductor thin film 3.

Figure 19D:
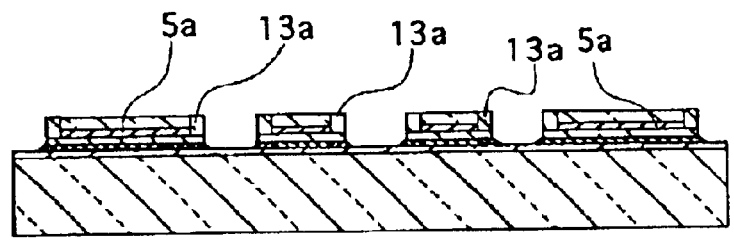

After forming the P type impurity regions 3p and the N type impurity regions 3n in the semiconductor thin film 3, similarly to EMBODIMENT 5-1, insulation walls 13a to surround the gate electrodes 5a are formed as shown in FIG. 19d. Specifically, an insulation film composed of silicon oxide, for example, is formed to cover entire one surface of the substrate 1, and anisotropic etching is carried out on the insulation film.

Figure 19E:
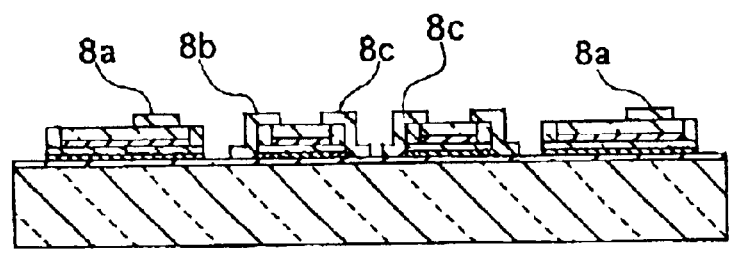
Figure 20A:
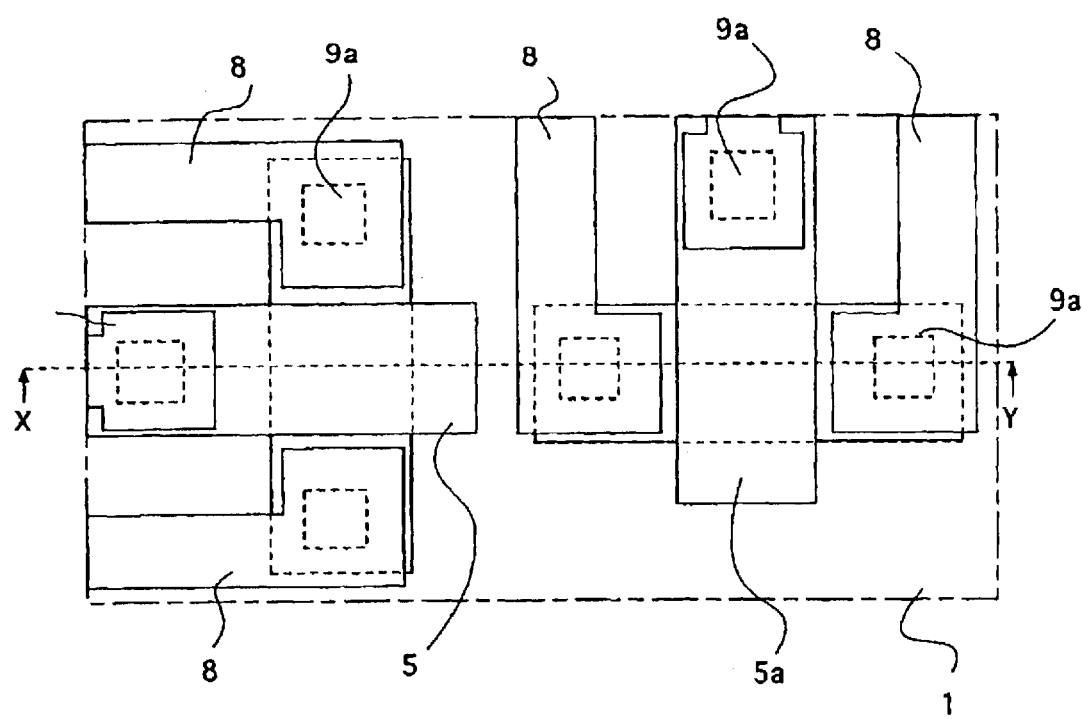
FIG. 20 a is a plan view showing a conventional TFT.
FIG. 20b is a schematic longitudinal section of the TFT.
Figure 20B:
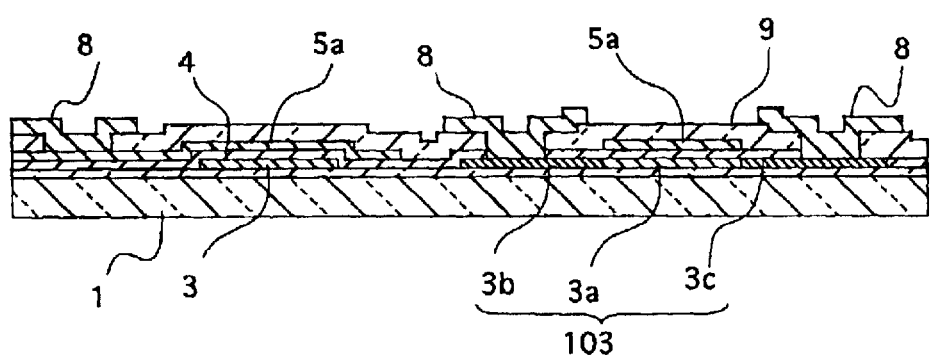
Figure 21A:
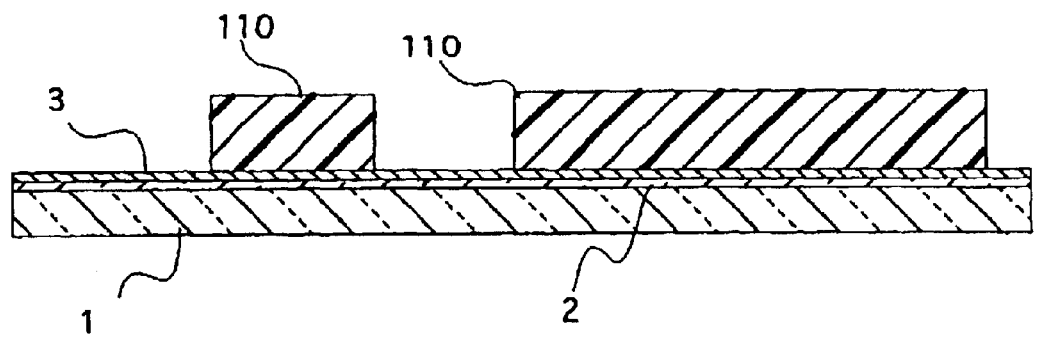
FIGS. 21a to 21e are schematic longitudinal sections showing the conditions of each step of the production process of the element.
Figure 21B:
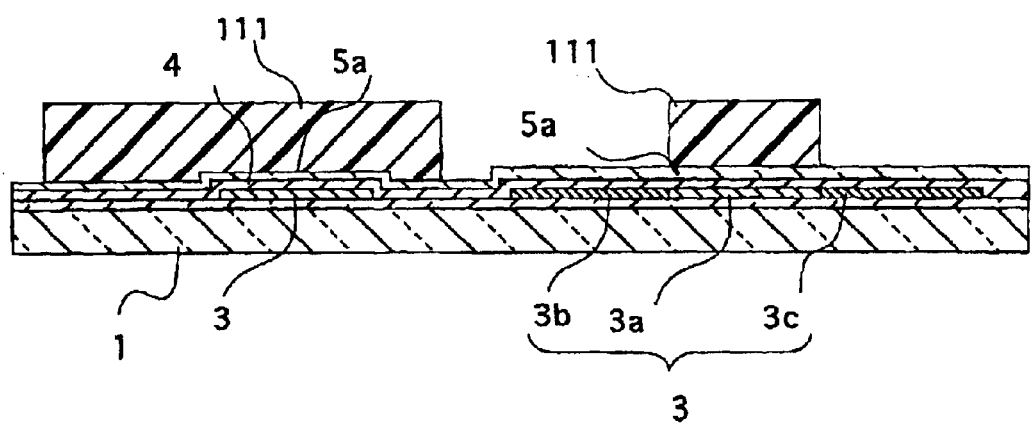
Figure 21C:
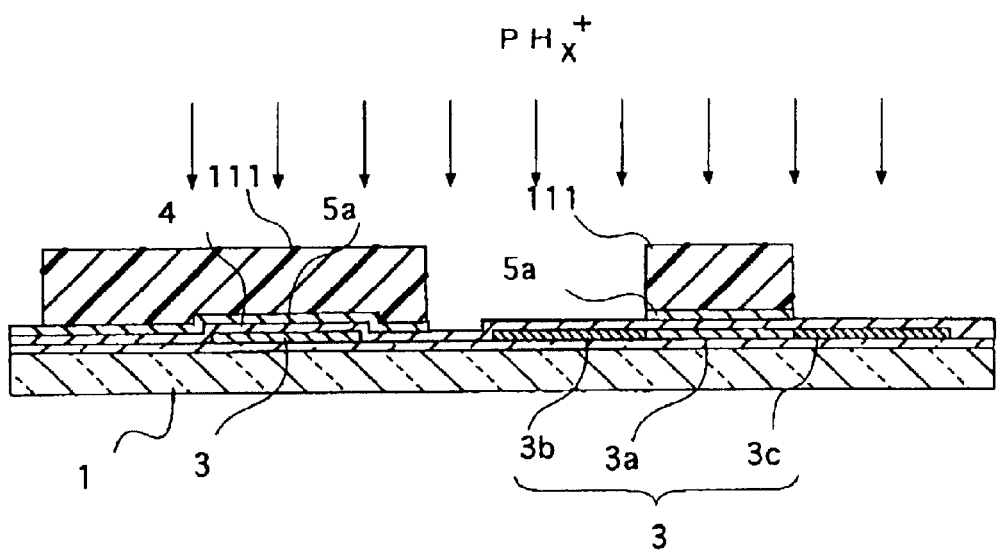
Figure 21D:
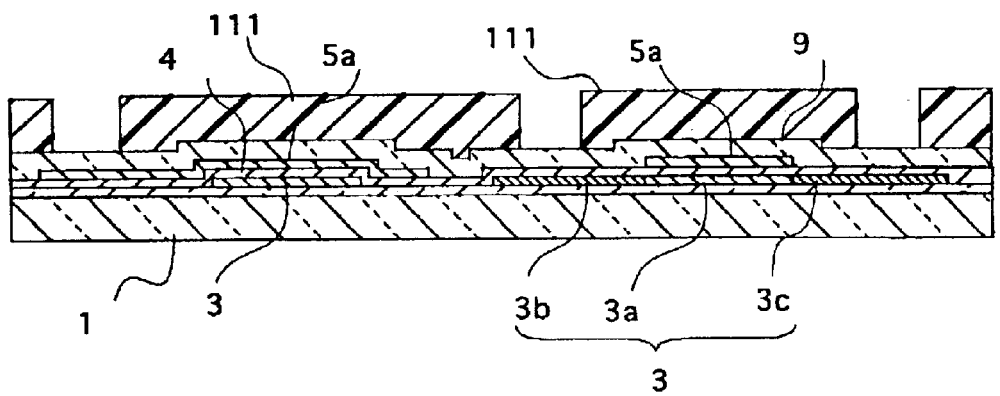
Figure 21E:
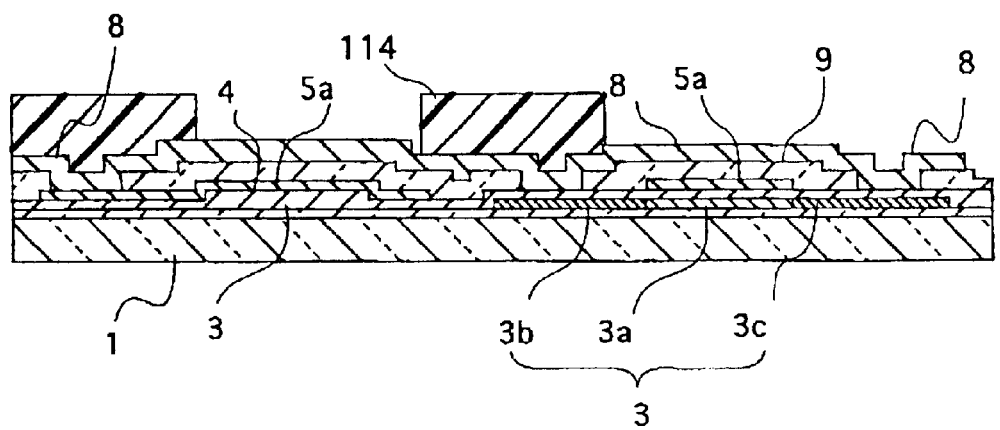

After forming the insulation walls 13a, as shown in FIG. 19e, wiring lines such as drain electrode wiring lines 8b and source electrode wiring lines 8c are formed. To cover the one surface of the substrate 1 having disposed thereon those films and the like, a conductive film composed of titanium, for example, is formed. Thereafter, unnecessary regions of the conductive film are removed by etching using, as masks, resist layers formed for forming the gate electrodes 5a and the insulation walls 13a, whereby wiring lines such as the drain electrode wiring lines 8b and the source electrode wiring lines 8c are formed. In addition, by this etching, the semiconductor thin film 3 is split.

After forming an insulation film 9 over the substrate 1, source regions 3b and drain regions 3c of the semiconductor thin film 3 are activated by carrying out heat treatment on the substrate 1. In addition, a decrease in contact resistance is attempted between the source regions 3b and source electrodes 5b and between the drain regions 3c and the drain electrode wiring lines 8c.

Next, contact holes 9a are formed in the insulation film 9, signal wiring lines 10a connected to electrodes such as scanning signal lines and image signal lines and other signal wiring lines are formed. Thus, the CMOS transistor shown in FIG. 18 is obtained.

Industrial Applicability

According to the present invention, it is made possible to provide a thin film semiconductor element which is small in area with high on-current enough to be suitable for the power saving and miniaturization of a device, and to provide such an element at low price. The use of this thin film semiconductor element in display panels such as liquid crystal display panels contributes to improvement in display qualities of the panels.

What is claimed is:

1. A thin film semiconductor element comprising:
   a semiconductor thin film having in a pair of edge portions thereof a source region and a drain region both implanted with impurity ions;
   an insulation film to cover one surface of the semiconductor thin film;
   a gate electrode disposed to counter a region of the semiconductor thin film via the insulation film, the region not being implanted with the impurity ions;
   a frame-shaped insulation wall to cover a periphery of the gate electrode;
   a source wiring line connected to the source region; and
   a drain wiring line connected to the drain region;
   wherein a whole of the semiconductor thin film is covered by the gate electrode, the insulation wall, the source wiring line, and the drain wiring line.

2. The thin film semiconductor element according to claim 1, wherein a distance between the source region and the drain region is equal to a size of the gate electrode in a same direction as the distance.

3. The thin film semiconductor element according to claim 2, wherein the source region and the drain region have regions which have lower concentrations of the impurity ions than other regions, the regions which have lower concentrations countering the insulation wall.

4. The thin film semiconductor element according to claim 1, wherein a distance between the source region and the drain region is equal to a size of the insulation wall in a same direction of the distance.

5. A thin film semiconductor element comprising:
   a semiconductor thin film having in a pair of edge portions thereof a source region and a drain region both implanted with impurity ions;
   a frame-shaped insulation wall to cover a periphery of the semiconductor thin film;
   an insulation film to cover one surface of the semiconductor thin film;
   a gate electrode disposed to counter a region of the semiconductor thin film via the insulation film, the region not being implanted with the impurity ions;
   a source wiring line connected to the source region; and
   a drain wiring line connected to the drain region;
   wherein an outer shape of the semiconductor thin film is substantially equal to an outer shape of the insulation wall.

6. The thin film semiconductor element according to claim 5, wherein the source region and the drain region are disposed only in regions countering the insulation wall.

7. The thin film semiconductor element according to claim 5, wherein one surface of the semiconductor thin film countering the insulation wall has a shape substantially equal to an outer shape of the insulation wall and smaller than an other surface of the thin film.

8. The thin film semiconductor element according to claim 7, wherein the source region and the drain region are composed of regions of the semiconductor thin film countering the insulation wall and regions of the thin film which are extended beyond side surfaces of the insulation wall, and the extended regions have higher concentrations of the impurity ions than the regions countering the insulation wall.

9. The thin film semiconductor element according to claim 5, wherein the source wiring line and the drain wiring line are composed of semiconductors each having higher concentrations of the impurity ions than the source region and the drain region disposed in the semiconductor thin film.

10. The thin film semiconductor element according to claim 5, wherein the source wiring line and the drain wiring line are connected to edge surfaces of the semiconductor thin film.

11. A display panel comprising, in each pixel, a light control means or a light emission means, and a switching element for controlling operations of the light control means and the light emission means, the switching element comprising:
- a semiconductor thin film having in a pair of edge portions thereof a source region and a drain region both implanted with impurity ions;
- an insulation film to cover one surface of the semiconductor thin film;
- a gate electrode disposed to counter a region of the semiconductor thin film via the insulation film, the region not being implanted with the impurity ions;
- a frame-shaped insulation wall to cover a periphery of the gate electrode;
- a source wiring line connected to the source region; and
- a drain wiring line connected to the drain region;
- wherein the display panel is composed of a thin film semiconductor element where a whole of the semiconductor thin film is covered by the gate electrode, the insulation wall, the source wiring line, and the drain wiring line.

12. The display panel according to claim 11, further comprising a liquid crystal layer, wherein the switching element carries out on/off controls of voltage signals to paired electrodes as the light control means.

13. The display panel according to claim 11, further comprising a light emission layer that emits light by applying voltage, wherein the switching element carries out on/off controls of voltage signals to light emission.

14. A display panel comprising, in each pixel, a light control means or a light emission means, and a switching element for controlling operations of the light control means and the light emission means, the switching element comprising:
- a semiconductor thin film having in a pair of edge portions thereof a source region and a drain region both implanted with impurity ions;
- a frame-shaped insulation wall to cover a periphery of the semiconductor thin film;
- an insulation film to cover one surface of the semiconductor thin film;
- a gate electrode disposed to counter a region of the semiconductor thin film via the insulation film, the region not being implanted with the impurity ions;
- a source wiring line connected to the source region; and
- a drain wiring line connected to the drain region;
- wherein an outer shape of the semiconductor thin film is substantially equal to an outer shape of the insulation wall.

15. The display panel according to claim 14, further comprising a liquid crystal layer, wherein the switching element carries out on/off controls of voltage signals to paired electrodes as the light control means.

16. The display panel according to claim 14, further comprising a light emission layer that emits light by applying voltage, wherein the switching element carries out on/off controls of voltage signals to the light emission.

17. A method of producing a thin film semiconductor element comprising a semiconductor thin film having a source region and a drain region both implanted with impurity ions, a gate electrode, and a source wiring line and a drain wiring line connected to the source region and the drain region, respectively, wherein impurity ions are implanted into predetermined regions of the semiconductor thin film using, as a mask, the gate electrode overlapped on the thin film via an insulation film, and wherein the semiconductor thin film is processed into a predetermined shape by etching using, as masks, previously formed element components including the gate electrode.

* * * * *

UNITED STATES PATENT AND TRADEMARK OFFICE
CERTIFICATE OF CORRECTION

PATENT NO. : 6,812,493 B2
DATED : November 2, 2004
INVENTOR(S) : Mikio Nishio et al.

It is certified that error appears in the above-identified patent and that said Letters Patent is hereby corrected as shown below:

Column 22,
Line 32, after "wherein" delete the following:
"a whole of the semiconductor thin film is covered by the gate electrode, the insulation wall, the source wiring line, and the drain wiring line.".
Line 32, after "wherein" add the following:
-- the semiconductor thin film has a shape substantially equal to an outer shape of a combination of the gate electrode, the insulation wall, the source wiring line, and the drain wiring line, and an upper surface of the semiconductor thin film is covered by the gate electrode, the insulation film, the source wiring line, and the drain wiring line. --.

Column 22, line 44 to Column 24,
Delete Claims 4-13.

Column 24,
Line 5, change "14." to -- 4. --.
Lines 13-14, delete "a frame-shaped insulation wall to cover a periphery of the semiconductor thin film;".
Line 19, insert the following new sub-paragraph:
-- a frame-shaped insulation wall to cover a periphery of the gate electrode; --.
Line 20, insert the following new sub-paragraph:
-- wherein the semiconductor thin film has a shape substantially equal to an outer shape of a combination of the gate electrode, the insulation wall, the source wiring line, and the drain wiring line, and an upper surface of the semiconductor thin film is covered by the gate electrode, the insulation film, the source wiring line, and the drain wiring line. --
Lines 21-23, delete in their entirety.
Line 24, change "15." to -- 5. --, and change "14" to -- 4 --.
Line 28, change "16." to -- 6. --, and change "14" to -- 4 --.
Line 32, change "17." to -- 7. --.

UNITED STATES PATENT AND TRADEMARK OFFICE
CERTIFICATE OF CORRECTION

PATENT NO. : 6,812,493 B2
DATED : November 2, 2004
INVENTOR(S) : Mikio Nishio et al.

It is certified that error appears in the above-identified patent and that said Letters Patent is hereby corrected as shown below:

Column 24 (cont'd),
Line 37, after "respectively," insert the following:
   --comprising the steps of:
   forming a semiconductor thin film on one surface of an insulation substrate;
   forming a first insulation film to cover the semiconductor thin film over the one surface of the insulation substrate;
   forming a first conductive film to cover the first insulation film over the one surface of the insulation substrate;
   forming a second insulation film to cover the conductive film over the over surface of the insulation substrate;
   processing the first conductive film into a gate electrode by etching using a first mask having a predetermined pattern;
   implanting impurity ions into the semiconductor thin film using the gate electrode as a mask;
   forming a frame-shaped insulation wall to cover side surfaces of the gate electrode;
   forming a second conductive film to cover the one surface of the insulation substrate having formed thereon the semiconductor thin film;
   processing the semiconductor thin film into a predetermined shape having a channel region, a source region, and a drain region by etching using, as masks, a second mask having a predetermined pattern, the gate electrode, and the insulation wall, and processing the second conductive film into a wiring line connected to the source region and a wiring line connected to the drain region;
   forming a third insulation film to cover the one surface of the insulation substrate having disposed thereon the semiconductor thin film;
   exposing the gate electrode by forming an aperture portion in the third insulation film; and
   forming another wiring lines connected to the gate electrode in a region including the aperture portion.--

UNITED STATES PATENT AND TRADEMARK OFFICE
CERTIFICATE OF CORRECTION

PATENT NO. : 6,812,493 B2
DATED : November 2, 2004
INVENTOR(S) : Mikio Nishio et al.

It is certified that error appears in the above-identified patent and that said Letters Patent is hereby corrected as shown below:

<u>Column 24 (cont'd),</u>
Line 37, after "respectively," delete the following:

"wherein impurity ions are thin film using, as a mask, the gate electrode overlapped on conductor thin film is processed into a predetermined shape by etching using, as masks, previously formed element components including the gate electrode."

Line 44, add the following claims:

--8. The method of producing a thin film semiconductor element according to claim 7, further comprising the step of, after the step of forming the insulation wall but before the step of forming the second conductive film, forming sub regions in the semiconductor thin film having higher concentrations of the impurity ions by implanting a same type of impurity ions as that used in the previous ion-implanting into the semiconductor thin film using the gate electrode and the insulation wall as masks.

9. The method of producing a thin film semiconductor element according to claim 7, wherein, in the step of implanting the impurity ions into the semiconductor thin film, P type ions and N type ions are implanted into different regions of the semiconductor thin film using masks having different patterns from each other.

10. The method of producing a thin film semiconductor element according to claim 7, wherein the insulation wall is formed such that an insulation film is formed to cover the gate electrode, and portions of the formed insulation film are removed by anisotropic etching so that only portions of the insulation film in a periphery of the gate electrode remain.

11. The method of producing a thin film semiconductor element according to claim 7, wherein the second conductive film is composed of a metal having a melting point of 1000°C or more.

UNITED STATES PATENT AND TRADEMARK OFFICE
CERTIFICATE OF CORRECTION

PATENT NO. : 6,812,493 B2
DATED : November 2, 2004
INVENTOR(S) : Mikio Nishio et al.

It is certified that error appears in the above-identified patent and that said Letters Patent is hereby corrected as shown below:

Column 24 (cont'd),

12. The method of producing a thin film semiconductor element according to claim 7, further comprising the step of, after the step of forming the third insulation film, carrying out heat treatment on the semiconductor thin film for activation.

13. A method of producing a thin film semiconductor element, comprising the steps of:

forming a semiconductor thin film on one surface of an insulation substrate;

forming a first insulation film to cover the semiconductor thin film over the one surface of the insulation substrate;

forming a first conductive film to cover the first insulation film over the one surface of the insulation substrate;

forming a second insulation film to cover the conductive film over the one surface of the insulation substrate;

processing the conductive film into a gate electrode by etching using a first mask having a predetermined pattern;

forming a frame-shaped insulation wall to cover side surfaces of the gate electrode;

implanting impurity ions into the semiconductor thin film using the gate electrode and the insulation wall as masks;

forming a second conductive film to cover the one surface of the insulation substrate having formed thereon the semiconductor thin film;

processing the semiconductor thin film into a predetermined shape having a channel region, a source region, and a drain region by etching using, as masks, a second mask having a predetermined pattern, the gate electrode, and the

UNITED STATES PATENT AND TRADEMARK OFFICE
CERTIFICATE OF CORRECTION

PATENT NO. : 6,812,493 B2
DATED : November 2, 2004
INVENTOR(S) : Mikio Nishio et al.

It is certified that error appears in the above-identified patent and that said Letters Patent is hereby corrected as shown below:

Column 24 (cont'd), insulation wall, and processing the second conductive film into a wiring line connected to the source region and a wiring line connected to the drain region;
     forming a third insulation film to cover the one surface of the insulation substrate having disposed thereon the semiconductor thin film;
     exposing the gate electrode by forming an aperture portion in the third insulation film; and
     forming another wiring line connected to the gate electrode in a region including the aperture portion.
     14. The method of producing a thin film semiconductor element according to claim 13, wherein, in the step of implanting the impurity regions into the semiconductor thin film, P type and N type impurity ions are implanted into different regions of the semiconductor thin film using yet other masks having predetermined patterns.
     15. The method of producing a thin film semiconductor element according to claim 13, wherein the insulation wall is formed such that an insulation film is formed to cover the gate electrode, and portions of the formed insulation film are removed by anisotropic etching so that only portions of the insulation film in a periphery of the gate electrode remain.
     16. The method of producing a thin film semiconductor element according to claim 13, wherein the second conductive film is composed of a metal having a melting point of 1000°C or more.

UNITED STATES PATENT AND TRADEMARK OFFICE
CERTIFICATE OF CORRECTION

PATENT NO. : 6,812,493 B2
DATED : November 2, 2004
INVENTOR(S) : Mikio Nishio et al.

It is certified that error appears in the above-identified patent and that said Letters Patent is hereby corrected as shown below:

Column 24 (cont'd),

17. The method of producing a thin film semiconductor element according to claim 13, further comprising the step of, after the step of forming the third insulation film, carrying out heat treatment on the semiconductor thin film for activation.

Signed and Sealed this

Twelfth Day of July, 2005

JON W. DUDAS
*Director of the United States Patent and Trademark Office*